United States Patent [19]

Harari

[11] Patent Number: 5,268,318
[45] Date of Patent: Dec. 7, 1993

[54] HIGHLY COMPACT EPROM AND FLASH EEPROM DEVICES

[76] Inventor: Eliyahou Harari, 2320 Friars La., Los Altos, Calif. 94022

[21] Appl. No.: 776,826

[22] Filed: Oct. 15, 1991

Related U.S. Application Data

[62] Division of Ser. No. 381,139, Jul. 17, 1989, Pat. No. 5,198,380, which is a division of Ser. No. 204,175, Jun. 8, 1988, Pat. No. 5,095,344.

[51] Int. Cl.⁵ .......................................... H01L 29/60
[52] U.S. Cl. ...................................... 437/43; 437/49; 257/320
[58] Field of Search .................... 437/43, 48, 52; 357/23.5; 365/185; 257/298, 320

[56] References Cited

U.S. PATENT DOCUMENTS

| | | |
|---|---|---|
| 4,380,863 | 4/1983 | Mohan Rao . |
| 4,409,723 | 10/1983 | Harari ................... 437/48 |
| 4,734,887 | 3/1988 | Sugatani ............... 365/185 |
| 4,888,734 | 12/1989 | Lee et al. ............. 365/185 |
| 5,095,344 | 3/1992 | Harari . |
| 5,168,465 | 12/1992 | Harari . |
| 5,198,380 | 3/1993 | Harari . |

FOREIGN PATENT DOCUMENTS

| | | |
|---|---|---|
| 164781A3 | 10/1985 | European Pat. Off. . |
| 0193841A2 | 1/1986 | European Pat. Off. . |
| 2077492 | 5/1981 | United Kingdom . |
| 2200795 | 1/1988 | United Kingdom . |

OTHER PUBLICATIONS

Masuoka et al., "A New Flash E2PROM Cell Using Triple Polysilicon Technology", *IEDM*, 84, pp. 464-467, (1984).

Primary Examiner—Olik Chaudhuri
Assistant Examiner—Richard A. Booth
Attorney, Agent, or Firm—Majestic, Parsons, Siebert & Hsue

[57] ABSTRACT

Structures, methods of manufacturing and methods of use of electrically programmable read only memories (EPROM) and flash electrically erasable and programmable read only memories (EEPROM) include split channel and other cell configurations. An arrangement of elements and cooperative processes of manufacture provide self-alignment of the elements. An intelligent programming technique allows each memory cell to store more than the usual one bit of information. An intelligent erase algorithm prolongs the useful life of the memory cells. Use of these various features provides a memory having a very high storage density and a long life, making it particularly useful as a solid state memory in place of magnetic disk storage devices in computer systems.

8 Claims, 28 Drawing Sheets

TABLE I. ARRAY OF FIGURE 15a.

| | $V_{CG}$ | | | $V_D$ | | | S | | | $V_{ERASE}$ | | |
|---|---|---|---|---|---|---|---|---|---|---|---|---|
| | SEL. CELL | UNSEL. CELL SAME ROW | UNSEL. CELL SAME COL. | SEL. CELL | UNSEL. CELL SAME ROW | UNSEL. CELL SAME COL. | SEL. CELL | UNSEL. CELL SAME ROW | UNSEL. CELL SAME COL. | SEL. CELL | UNSEL. CELL SAME ROW | UNSEL. CELL SAME COL. |
| READ | 5V | 5V | 0V | 1.5V | 0V | 1.5V | 0V | 0V | 0V | 0V | 0V | 0V |
| ERASE | 0V | 0V | 0V | 0V | 0V | 0V | 0V | 0V | 0V | 20V | 20V (BLOCK ERASE) | 20V (BLOCK ERASE) |
| PROGRAM | 12V | 12V | 0V | 8V | 0V | 8V | 0V | 0V | 0V | 0V | 0V | 0V |

FIG. 17a

TABLE II. VIRTUAL GROUND ARRAY OF FIGURE 15b.

| | $V_{CG}$ | | | $V_D$ | | | S | | | $V_{ERASE}$ | | |
|---|---|---|---|---|---|---|---|---|---|---|---|---|
| | SEL. CELL | UNSEL. CELL | | SEL. CELL | UNSEL. CELL | | SEL. CELL | UNSEL. CELL | | SEL. CELL | UNSEL. CELL | |
| | | SAME ROW | SAME COL. | | SAME ROW | SAME COL. | | SAME ROW | SAME COL. | | SAME ROW | SAME COL. |
| READ | 5V | 5V | 0V | 1.5V | 1.5V | 1.5V | 0V | 0V | 0V | 0V | 0V | 0V |
| ERASE | 0V | 0V | 0V | 0V | 0V | 0V | 0V | 0V | 0V | 20V | 20V (BLOCK ERASE) | 20V (BLOCK ERASE) |
| PROGRAM | 12V | 12V | 0V | 8V | FLOAT | 8V | ~0V | FLOAT | ~0V | 0V | 0V | 0V |

FIG. 17b

HIGHLY COMPACT EPROM AND FLASH EEPROM DEVICES

This is a division of application Ser. NO. 381,139, filed Jul. 17, 1989, now U.S. Pat. No. 5,198,380 which in turn is a division of application Ser. No. 204,175, filed Jun. 8, 1988, now U.S. Pat. No. 5,095,344.

BACKGROUND OF THE INVENTION

This invention relates generally to semiconductor electrically programmable read only memories (Eprom) and electrically erasable programmable read only memories (EEprom), and specifically to semiconductor structures of such memories, processes of making them, and techniques for using them.

An electrically programmable read only memory (Eprom) utilizes a floating (unconnected) conductive gate, in a field effect transistor structure, positioned over but insulated from a channel region in a semiconductor substrate, between source and drain regions. A control gate is then provided over the floating gate, but also insulated therefrom. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate. A transistor is programmed to one of two states by accelerating electrons from the substrate channel region, through a thin gate dielectric and onto the floating gate.

The memory cell transistor's state is read by placing an operating voltage across its source and drain and on its control gate, and then detecting the level of current flowing between the source and drain as to whether the device is programmed to be "on" or "off" at the control gate voltage selected. A specific, single cell in a two-dimensional array of Eprom cells is addressed for reading by application of a source-drain voltage to source and drain lines in a column containing the cell being addressed, and application of a control gate voltage to the control gates in a row containing the cell being addressed.

This type of Eprom transistor is usually implemented in one of two basic configurations. One is where the floating gate extends substantially entirely over the transistor's channel region between its source and drain. Another type, preferred in many applications, is where the floating gate extends from the drain region only part of the way across the channel. The control gate then extends completely across the channel, over the floating gate and then across the remaining portion of the channel not occupied by the floating gate. The control gate is separated from that remaining channel portion by a thin gate oxide. This second type is termed a "split-channel" Eprom transistor. This results in a transistor structure that operates as two transistors in series, one having a varying threshold in response to the charge level on the floating gate, and another that is unaffected by the floating gate charge but rather which operates in response to the voltage on the control gate as in any normal field effect transistor.

Early Eprom devices were erasable by exposure to ultraviolet light. More recently, the transistor cells have been made to be electrically erasable, and thus termed electrically erasable and programmable read only memory (EEprom). One way in which the cell is erased electrically is by transfer of charge from the floating gate to the transistor drain through a very thin tunnel dielectric. This is accomplished by application of appropriate voltages to the transistor's source, drain and control gate. Other EEprom memory cells are provided with a separate, third gate for accomplishing the erasing. An erase gate passes through each memory cell transistor closely adjacent to a surface of the floating gate but insulated therefrom by a thin tunnel dielectric. Charge is then removed from the floating gate of a cell to the erase gate, when appropriate voltages are applied to all the transistor elements. An array of EEprom cells are generally referred to as a Flash EEprom array because an entire array of cells, or significant group of cells, is erased simultaneously (i.e., in a flash).

EEprom's have been found to have a limited effective life. The number of cycles of programming and erasing that such a device can endure before becoming degraded is finite. After a number of such cycles in excess of 10,000, depending upon its specific structure, its programmability can be reduced. Often, by the time the device has been put through such a cycle for over 100,000 times, it can no longer be programmed or erased properly. This is believed to be the result of electrons being trapped in the dielectric each time charge is transferred to or away from the floating gate by programming or erasing, respectively.

It is the primary object of the present invention to provide Eprom and EEprom cell and array structures and processes for making them that result in cells of reduced size so their density on a semiconductor chip can be increased. It is also an object of the invention that the structures be highly manufacturable, reliable, scalable, repeatable and producible with a very high yield.

It is yet another object of the present invention to provide EEprom semiconductor chips that are useful for solid state memory to replace magnetic disk storage devices.

Another object of the present invention is to provide a technique for increasing the amount of information that can be stored in a given size Eprom or EEprom array.

Further, it is an object of the present invention to provide a technique for increasing the number of program/read cycles that an EEprom can endure.

SUMMARY OF THE INVENTION

These and additional objects are accomplished by the various aspects of the present invention, either alone or in combination, the primary aspects being briefly summarized as below:

1. The problems associated with prior art split channel Eprom and split channel Flash EEprom devices are overcome by providing a split channel memory cell constructed in one of the following ways:

(A) In one embodiment, one edge of the floating gate is self aligned to and overlaps the edge of the drain diffusion and the second edge of the floating gate is self aligned to but is spaced apart from the edge of the source diffusion. A sidewall spacer formed along the second edge of the floating gate facing the source side is used to define the degree of spacing between the two edges. Self alignment of both source and drain to the edges of the floating gate results in a split channel Eprom device having accurate control of the three most critical device parameters: Channel segment lengths L1 and L2 controllable by floating gate and control gate, respectively, and the extent of overlap between the floating gate and the drain diffusion. All three parameters are insensitive to mask misalignment and can be made reproducibly very small in scaled-down devices.

(B) In a second embodiment of the split channel Eprom a heavily doped portion of the channel adjacent to the drain diffusion is formed by a novel, well-controlled technique. The length Lp and doping concentration of this channel portion become the dominant parameters for programming and reading, thereby permitting the formation of a split channel structure which is relatively insensitive to misalignments between the floating gate and the source/drain regions.

2. A separate erase gate is provided to transform a Eprom device into a Flash EEprom device. The area of overlap between the floating gate and the erase gate is insensitive to mask misalignment and can therefore be made reproducibly very small.

3. In some embodiments of this invention, the erase gate is also used as a field plate to provide very compact electric isolation between adjacent cells in a memory array.

4. A new erase mechanism is provided which employs tailoring of the edges of a very thin floating gate so as to enhance their effectiveness as electron injectors.

5. A novel intelligent programming and sensing technique is provided which permits the practical implementation of multiple state storage wherein each Eprom or flash EEprom cell stores more than one bit per cell.

6. A novel intelligent erase algorithm is provided which results in a significant reduction in the electrical stress experienced by the erase tunnel dielectric and results in much higher endurance to program/erase cycling.

The combination of various of these features results in new split channel Eprom or split channel Flash EEprom devices which are highly manufacturable, highly scalable, and offering greater storage density as well as greater reliability than any prior art Eprom or Flash EEprom devices. Memories that utilize the various aspects of this invention are especially useful in computer systems to replace existing magnetic storage media (hard disks and floppy disks), primarily because of the very high density of information that may be stored in them.

Additional objects, features and advantages of the present invention will be understood from the following description of its preferred embodiments, which description should be taken in conjunction with the accompanying drawings.

BRIEF DESCRIPTION OF THE DRAWINGS

FIG. 3b is a schematic view of the Masuoka prior art cell of FIG. 3a.

FIG. 6b is a view along cross section AA of the structure of FIG. 6a.

FIG. 7b is a view along cross section AA of the structure of FIG. 7a.

FIG. 7c is a view along cross section CC of the structure of FIG. 7a.

FIG. 8b is a view along cross section AA of the structure of FIG. 8a.

FIG. 9b is a view along cross section AA of the structure of FIG. 9a.

FIG. 9c is a view along cross section DD of the structure of FIG. 9a.

FIG. 17a contains Table I which shows voltage conditions for all operational modes for the array of FIG. 15a.

FIG. 17b contains Table II which shows example voltage conditions for all operational modes for the virtual ground array of FIG. 15b.

DETAILED DESCRIPTION OF THE PRIOR ART

There are two distinctly different approaches in the prior art of Flash EEproms. A triple polysilicon device was described by J. Kupec et al. in 1980 *IEDM Technical Digest*, p. 602 in an article entitled "Triple Level Polysilicon EEprom with Single Transistor per Bit". An improvement to the Kupec device was proposed by F. Masuoka and H. Iizuka in U.S. Pat. No. 4,531,203, issued Jul. 23, 1985. Variations on the same cell are described by C. K. Kuo and S. C. Tsaur in U.S. Pat. No. 4,561,004 issued Dec. 24, 1985, and by F. Masuoka et al. in an article titled "A 256K Flash EEprom Using Triple Polysilicon Technology", *Digest of Technical Papers, IEEE International Solid-State Circuits Conference*, February 1985, p. 168.

Figure 1:
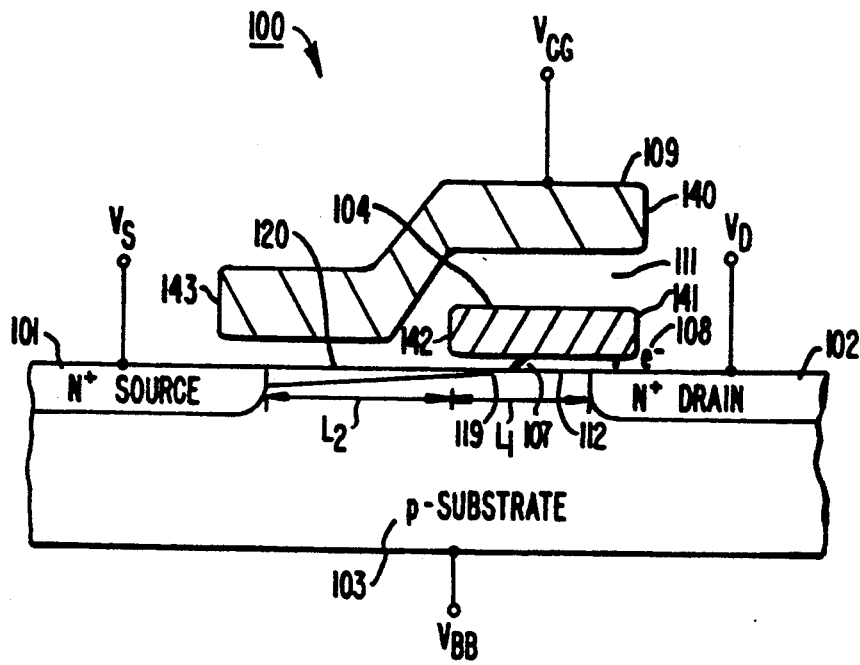
FIG. 1 is a cross section of the split channel Flash EEprom Samachisa prior art cell which erases by tunneling of electrons from the floating gate to the drain diffusion.

The second approach is a double polysilicon cell described by G. Samachisa et al., in an article titled "A 128K Flash EEprom Using Double Polysilicon Technology", *IEEE Journal of Solid State Circuits*, October 1987, Vol. SC-22, No. 5, p. 676. Variations on this second cell are also described by H. Kume et al. in an article titled "A Flash-Erase EEprom Cell with an Asymmetric Source and Drain Structure", *Technical Digest of the IEEE International Electron Devices Meeting*, December 1987, p. 560, and by V. N. Kynett et al. in an article titled "An In-System Reprogrammable 256K CMOS Flash Memory", *Digest of Technical Papers, IEEE International Solid-State Circuits Conference*, February 1988, p. 132. A cross-section of the Samachisa cell is shown in FIG. 1. Transistor 100 is an NMOS transistor with source 101, drain 102, substrate 103, floating gate 104 and control gate 109. The transistor has a split channel consisting of a section 112 (L1) whose conductivity is controlled by floating gate 104, in series with a section 120 (L2) whose conductivity is controlled by control gate 109. Programming takes place as in other Eprom cells by injection of hot electrons 107 from the channel at the pinchoff region 119 near the drain junction. Injected electrons are trapped on floating gate 104 and raise the conduction threshold voltage of channel region 112 and therefore of transistor 100. To erase transistor 100 the oxide in region 112 separating between the floating gate 104 and drain diffusion 102 and channel 112 is thinned to between 15 and 20 nanometers, to allow electronic tunneling of trapped electrons 108 from the floating gate to the drain. In the Samachisa cell the appropriate voltages applied to achieve programming are $V_{CG}=12V$, $V_D=9V$, $V_{BB}=0V$, $V_S=0V$, and to achieve erase are $V_{CG}=0V$, $V_D=19V$, $V_{BB}=0V$, $V_S=$floating. Samachisa points out that the electrical erase is not self-limiting. It is possible to overerase the cell, leaving the floating gate positively charged, thus turning the channel portion L1 into a depletion mode transistor. The series enhancement transistor L2 is needed therefore to prevent transistor leakage in the overerase condition.

The Samachisa cell suffers from certain disadvantages. These are:

(a) It is difficult to prevent avalanche junction breakdown or high junction leakage current at the drain junction 102 during the time the very high erase voltage is applied to the drain;

(b) It is difficult to grow with high yields the thin oxide layer 112 used for tunnel erase;

(c) Because of the presence of thin oxide layer between the floating gate and the drain diffusion, it is difficult to prevent accidental tunneling of electrons from the floating gate to the drain in what is known as the "program disturb" condition. Under this condition an unselected cell in a memory array sharing the same drain (bit line) as a programmed cell may have a drain voltage of approximately 10 volts and a control gate voltage of 0 volts. Although this represents a much weaker electric field than that experienced during tunnel erase (when the drain is at approximately 19 volts), it nevertheless can, over a prolonged period of time alter by slow tunneling the charge stored on the floating gate.

Figure 2A:
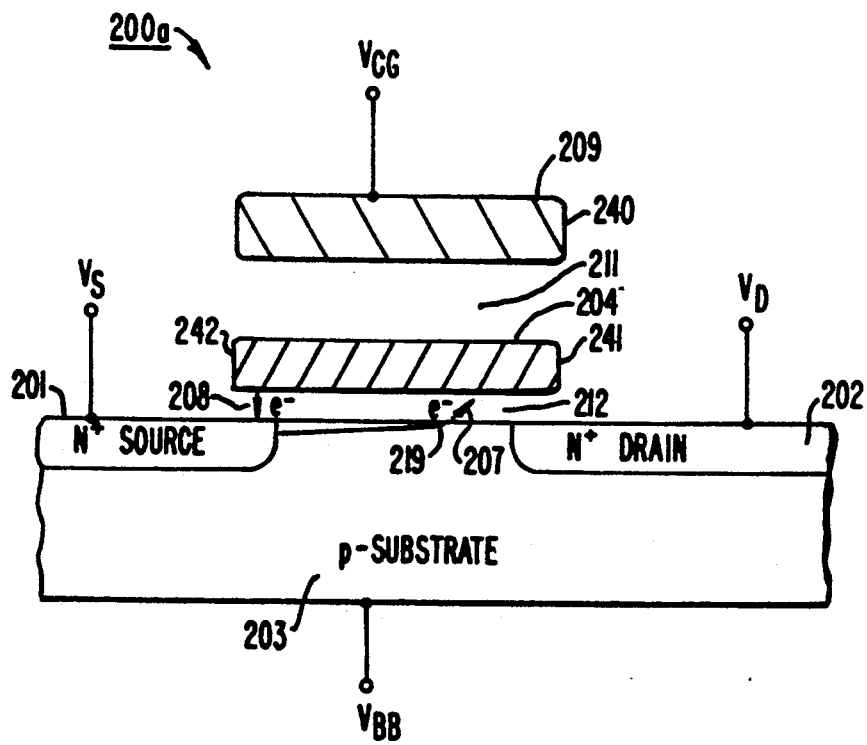
FIG. 2a is a cross section of the Flash EEprom Kynett prior art cell which erases by tunneling of electrons from the floating gate to the source diffusion.

The Kynett and Kume cells (FIG. 2a) are similar to the Samachisa cell except for the elimination of the series enhancement transistor 120, and the performing of tunnel erase 208 over the source diffusion 201 rather than over the drain diffusion 202. Typically the Kynett cell uses during programming voltages $V_{CG}=12V$, $V_D=8V$, $V_S=0V$, $V_{BB}=0V$, and during erase voltages $V_S=12V$, $V_{BB}=0V$, $V_{CG}=)V$, $V_D=$Floating. Kynett achieves a lower erase voltage than Samachisa by thinning tunnel dielectric 212 to 10 nanometers or less, so that even though the voltage applied to the source diffusion during erase is reduced, the electric field across tunnel dielectric 212 remains as high as in the case of the Samachisa cell.

The Kynett cell can be contrasted with the Samachisa cell:

(a) Kynett is less susceptible to avalanche breakdown of source diffusion 201 during erase because the voltage is reduced from 19 volts to 12 volts.

(b) Kynett's cell is more susceptible to low yields due to pinholes in the thin dielectric layer 212 because its thickness is reduced from approximately 20 nanometers to approximately 10 nanometers.

(c) Because Kynett uses a lower voltage for erase but essentially the same drain voltage for programming Kynett is far more susceptible to accidental "program disturb" due to partial tunnel erase (during programming) occuring from floating gate 204 to drain 202.

(d) Kynett's cell is highly susceptible to an overerase condition because it does not have the series enhancement channel portion 120 of Samachisa's cell. To prevent overerase Kynett et al. deploy a special erase algorithm. This algorithm applies a short erase pulse to an array of cells, then measures the threshold voltage of all cells to ensure that no cell has been overerased into depletion. It then applies a second erase pulse and repeats the reading of all cells in the array. This cycle is stopped as soon as the last cell in the array has been erased to a reference enhancement voltage threshold level. The problem with this approach is that the first cell to have been adequately erased continues to receive erase pulses until the last cell has been adequately erased, and may therefore be susceptible to overerase into a depletion threshold state.

Figure 2B:
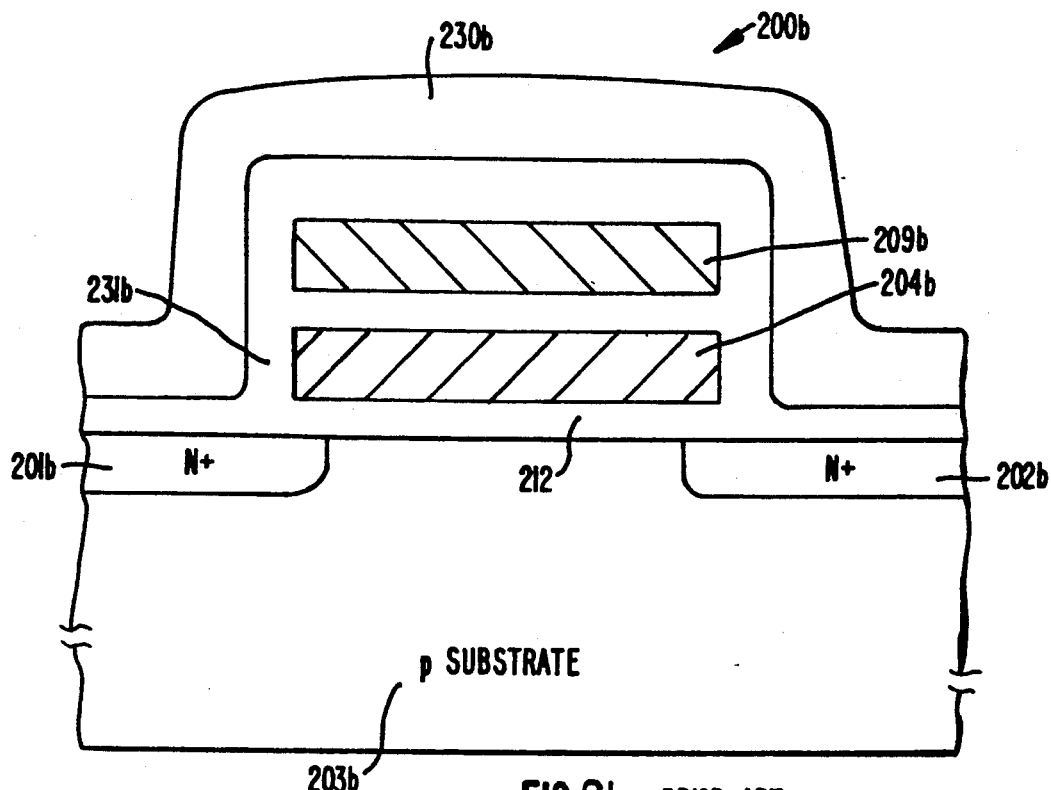
FIG. 2b is a cross section of the Flash EEprom Kupec prior art cell with triple polysilicon.
Figure 2C:
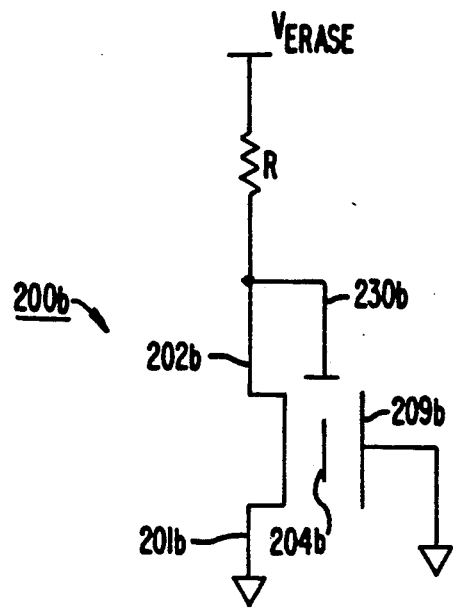
FIG. 2c is a schematic of the Kupec cell during erase.

Kupec's cell employs essentially the Kynett cell without a thin tunnel dielectric over the source, channel, or drain, and with a third polysilicon plate covering the entire transistor and acting as an erase plate. A cross sectional view of the Kupec device is shown in FIG. 2b. Transistor 200b consists of a stacked floating gate 204b and control gate 209b with source 201b and drain 202b self aligned to the edges of the floating gate. Gate dielectric 212 is relatively thick and does not permit tunnel erase from floating gate to source or drain. An erase plate 230b overlies the control gate and covers the sidewalls of both the control gate and the floating gate. Erase takes place by tunneling across the relatively thick oxide 231b between the edges of floating gate 204b and erase plate 230b. Kupec attempts to overcome the overerase condition by connecting the erase plate during high voltage erase to drain 202b and through a high impedance resistor R (FIG. 2c) to the erase supply voltage $V_{ERASE}$. As soon as the cell is erased into depletion the drain to source transistor conduction current drops most of the erase voltage across the resistor, reducing the voltage on the erase plate 230b to below the tunneling voltage. This approach is extremely difficult to implement in a block erase of a large array because different transistors begin conduction at different times.

Figure 3A:
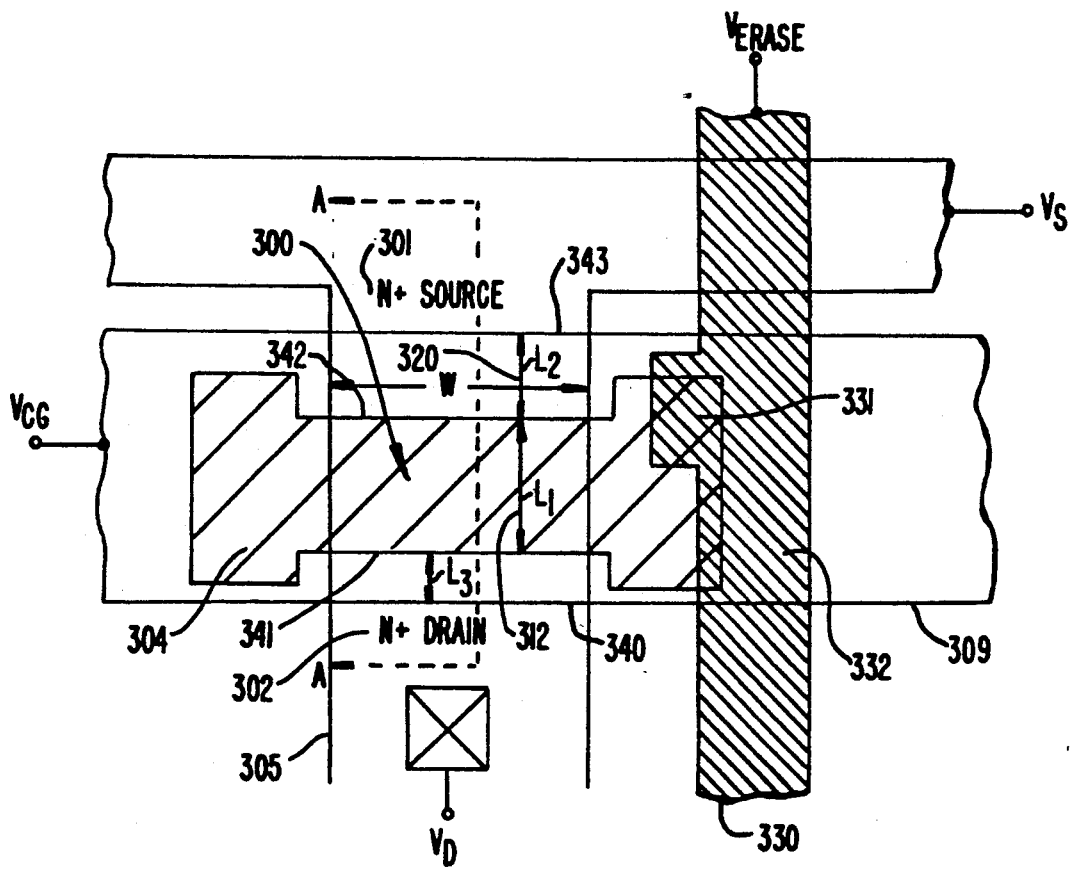
FIG. 3a is a topological view of the triple polysilicon split channel Flash EEprom prior art Masuoka cell which erases by tunneling of electrons from the floating gate to an erase gate.
Figure 3B:
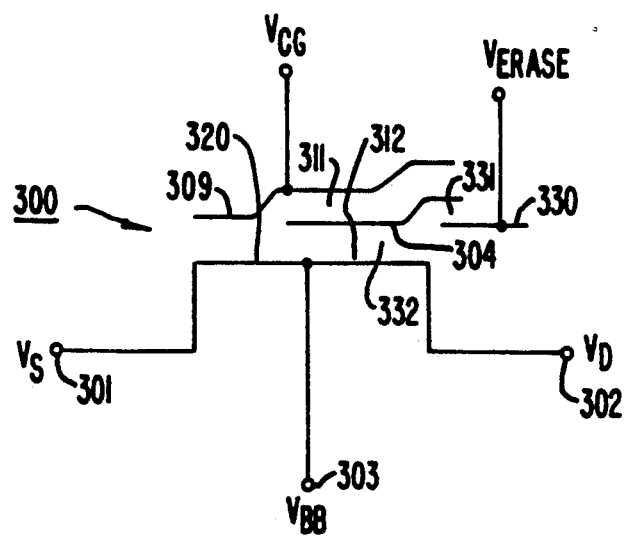
Figure 3C:
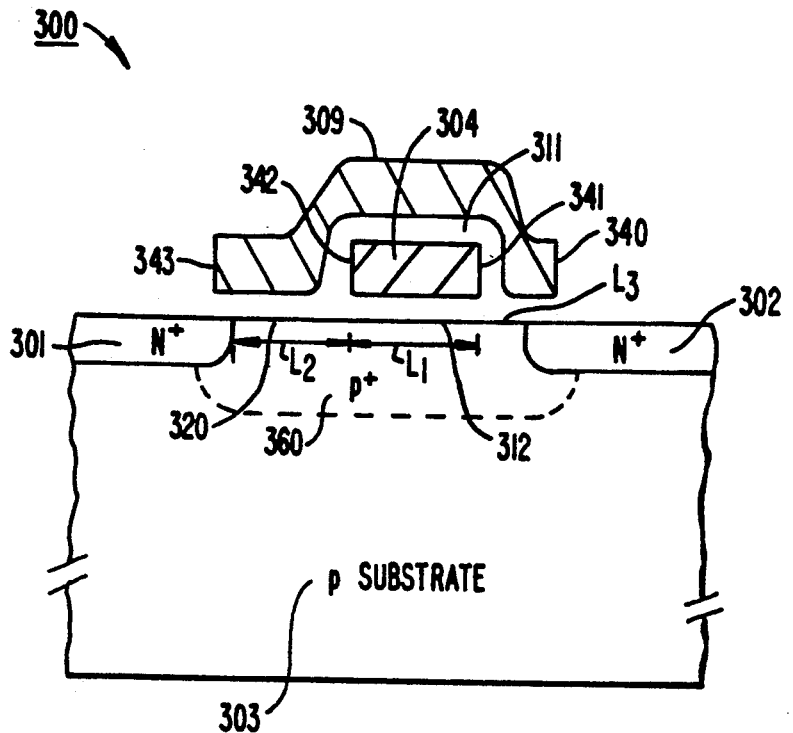
FIG. 3c is a view of the Masuoka prior art cell of FIG. 3a along cross section AA.

Masuoka's approach to Flash EEprom overcomes most of the disadvantages of the Samachisa, Kynett and Kupec cells FIG. 3a provides a top view of the Masuoka prior art cell, FIG. 3b shows the schematic representation of the same cell, and FIG. 3c provides a cross section view along the channel from source to drain. Transistor 300 consists of a split channel Eprom transistor having a source 301, a drain 302, a floating gate 304 controlling channel conduction along section L1 (312) of the channel, a control gate 309 capacitively coupled to the floating gate and also controlling the conduction along the series portion of the channel L2 (320), which has enhancement threshold voltage.

The transistor channel width (W), as well as the edges of the source and drain diffusions are defined by the edges 305 of a thick field oxide formed by isoplanar oxidation. Oxide 332 of thickness in the 25 to 40 nanometers range is used as isolation between the floating gate and the substrate. Masuoka adds an erase gate 330 disposed underneath the floating gate along one of its edges. This erase gate is used to electrically erase floating gate 304 in an area of tunnel dielectric 331 where the floating gate overlaps the erase gate. Tunnel dielectric 331 is of thickness between 30 and 60 nanometers.

Masuoka specifies the following voltages during erase: $V_S=0V$, $V_D=0V$, $V_{CG}=0V$, $V_{BB}=0V$, $V_{ERASE}=20V$ to 30V.

Comparing the Masuoka cell with the Samachisa and Kynett cells:

(a) Masuoka's cell does not erase by using either the source diffusion or the drain diffusion for tunnel erase. Therefore these diffusions never experience a voltage higher than during Eprom programming. The junction avalanche breakdown and junction leakage problems therefore do not exist.

(b) Masuoka's cell uses a relatively thick tunnel dielectric and therefore does not need to use thin tunnel dielectrics for erase. Therefore it is less susceptible to oxide pinholes introduced during the manufacturing cycle.

Masuoka's cell does not have a "program disturb" problem because programming and tunnel erase involve two different mechanisms occuring at two different regions of the transistor.

(d) Masuoka's cell is not susceptible to the overerase condition because of the presence of the series enhancement transistor channel 320 (L2).

(e) Masuoka's cell requires a third layer of polysilicon, which complicates the process as well aggravates the surface topology. Because the erase gate consumes surface area over the field oxide 305 it results in a larger cell.

(f) The overlap area 331 in Masuoka's cell is sensitive to mask misalignment between the two masks defining this overlap. Since the overlap area is nominally very small, even small misalignments can result in large variations in the area used for tunnel erase. This results in severe variations from wafer to wafer.

From the foregoing analysis it is clear that while the Masuoka prior art cell successfully addresses most of the problems encountered by Samachisa and Kynett, it itself has disadvantages not encountered by Samachisa or Kynett.

Masuoka and Samachisa both use a split channel Eprom transistor for programming. In the split channel eprom transistor, the portion L2 of the channel length controlled by control gate 109, 309 has a fixed enhancement threshold voltage determined by the p+ channel doping concentration 360. The portion L1 of the channel length controlled by floating gate 104 (Samachisa) and 304 (Masuoka) has a variable threshold voltage determined by the net charge stored on the floating gate.

Figure 3D:
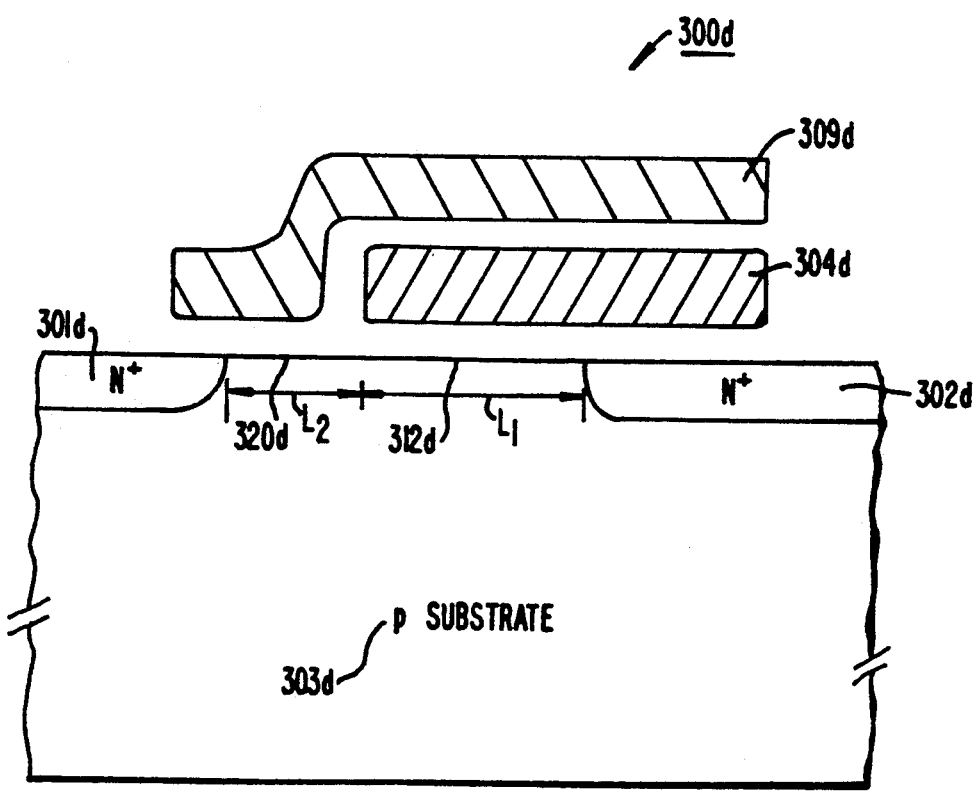
FIG. 3d is a cross section view of the split channel Eprom Harari prior art cell.

Other prior art split channel Eprom transistors are described by E. Harari in U.S. Pat. No. 4,328,565, May 4, 1982 and by B. Eitan in U.S. Pat. No. 4,639,893, Jan. 27, 1987. The Harari split channel Eprom transistor 300d is shown in cross section in FIG. 3d. Source 301d and drain 302d are formed prior to formation of the floating gate 304d. Therefore, the total channel length L1+L2 is insensitive to mask misalignment However, both L1 and L2 are sensitive to misalignment between floating gate 304d and drain diffusion 302d.

Figure 4A:
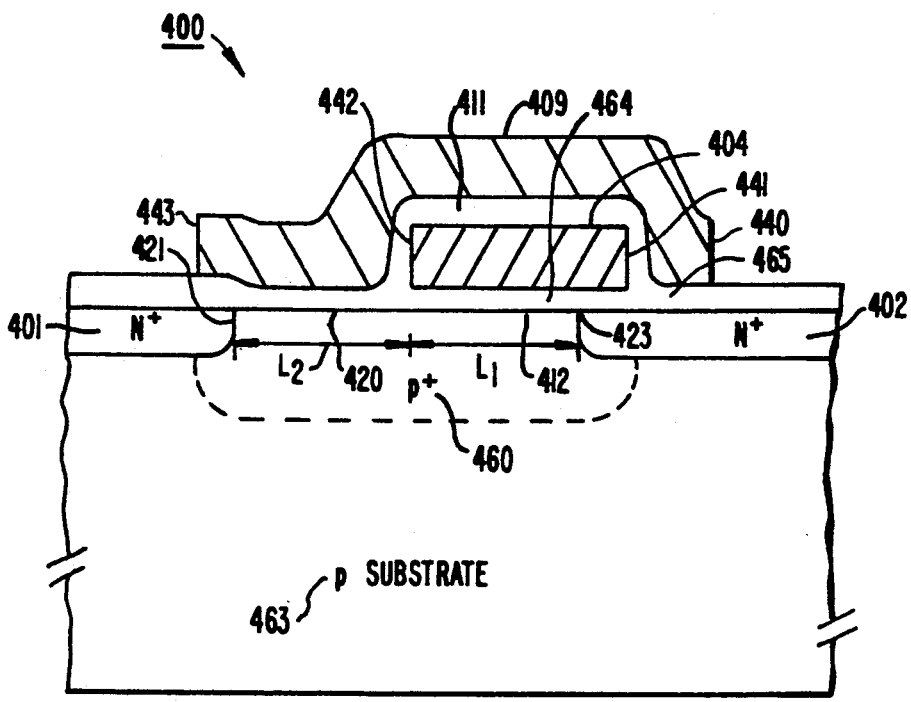
FIG. 4a is a cross section view of the split channel Eprom Eitan prior art cell having a drain diffusion self aligned to one edge of the floating gate.

The Eitan split channel Eprom transistor 400 is shown in cross sections in FIG. 4a. The Eitan patent highlights the main reasons for using a split channel architecture rather than the standard self aligned stacked gate Eprom transistor 200 (FIG. 2). These reasons can be summarized as follows:

The addition of a fixed threshold enhancement transistor in series with the floating gate transistor decouples the floating gate from the source diffusion This allows the channel length L1 to be made very small without encountering punchthrough between source and drain. Furthermore, transistor drain-turnon due to the parasitic capacitive coupling between the drain diffusion and the floating gate is eliminated because the enhancement channel portion L2 remains off.

Eitan shows that the shorter the length L1 the greater the programming efficiency and the greater the read current of the split channel Eprom transistor. For Flash EEprom devices the series enhancement channel L2 acquires additional importance because it allows the floating gate portion L1 to be overerased into depletion threshold voltage without turning on the composite split channel transistor.

The disadvantages incurred by the addition of the series enhancement channel L2 are an increase in cell area, a decrease in transistor transconductance, an increase in control gate capacitance, and an increase in variability of device characteristics for programming and reading brought about by the fact that L1 or L2 or both are not precisely controlled in the manufacturing process of the prior art split channel devices. Samachisa, Masuoka and Eitan each adopt a different approach to reduce the variability of L1 and L2:

Samachisa's transistor 100 (FIG. 1) uses the two edges 140, 143 of control gate 109 to define (by a self aligned ion implant) drain diffusion 102 and source diffusion 101. Edge 141 of floating gate 104 is etched prior to ion implant, using edge 140 of control gate 109 as an etch mask. This results in a split channel transistor where (L1+L2) is accurately controlled by the length between the two edges 140, 143 of the control gate However, L1 and L2 are both sensitive to misalignment between the mask defining edge 142 and the mask defining edges 140, 143.

Masuoka's transistor 300 (FIG. 3c) forms both edges 341, 342 of floating gate 304 in a single masking step. Therefore L1 is insensitive to mask misalignment L2, which is formed by ion implant of source diffusion 301 to be self aligned to edge 343 of control gate 309, is sensitive to misalignment between the mask defining edge 342 and the mask defining edge 343. Furthermore the Masuoka transistor 300 may form a third channel region L3, if edge 340 of control gate 309 is misaligned in a direction away from edge 341 of floating gate 304. the formation of L3 will severely degrade the programming efficiency of such a cell.

Figure 4B:
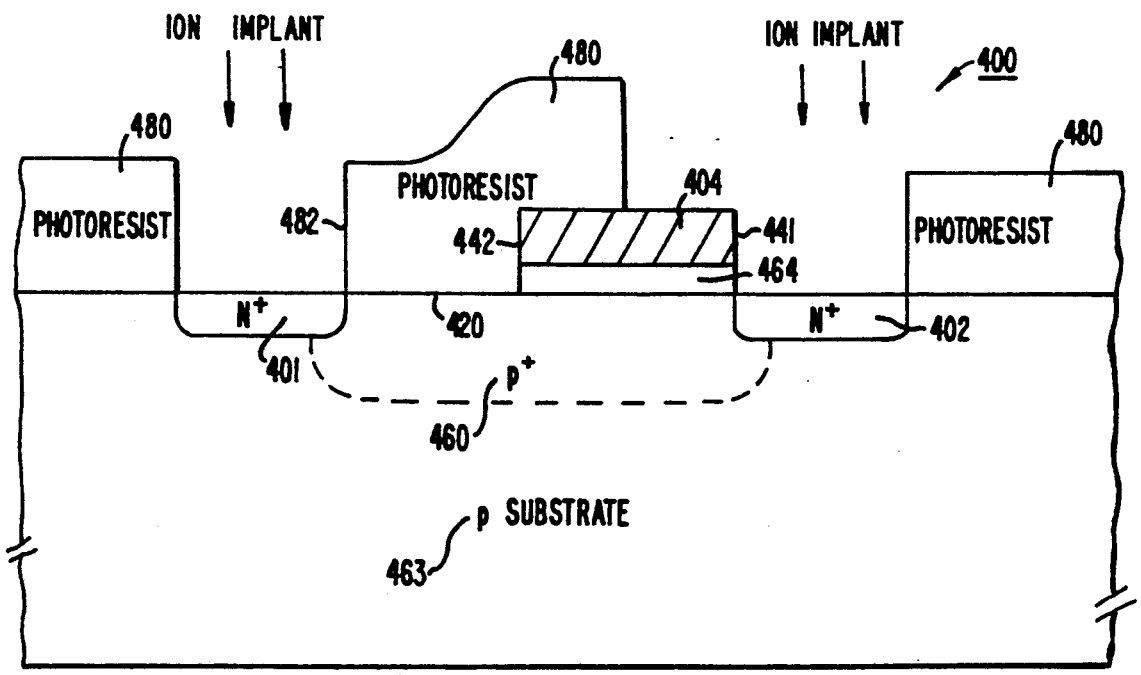
FIG. 4b is a cross section view of the prior art Eitan cell of FIG. 4a during the process step used in the formation of the self aligned drain diffusion.

Eitan's transistor 400 (FIGS. 4a, 4b) uses a separate mask layer 480 to expose the edge of floating gate 404 to allow drain diffusion 402 to be self aligned (by ion implantation) to edge 441 of floating gate 404. Therefore L1 can be accurately controlled and is not sensitive to mask misalignment. L2 however is sensitive to the misalignment between edge 482 of photoresist 480 and edge 442 of the floating gate. Eitan claims that the variability in L2 due to this mask misalignment, can be as much as 1.0 micron or more without affecting the performance of the device (see claims 3,4 of the above-referenced Eitan patent).

It should be pointed out that even with the most advanced optical lithography systems available today in a production environment it is difficult to achieve alignment accuracy of better than +0.25 microns between any two mask layers. Therefore the variability in L2 or L1 inherent to any structure which is alignment sensitive can be as much as approximately 0.5 microns from one extreme to the other.

Figure 4C:
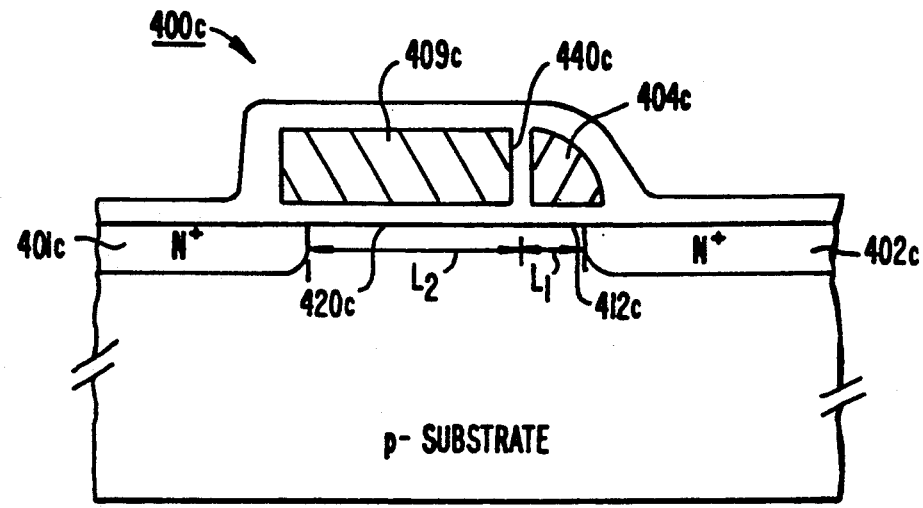
FIG. 4c is a cross section view of the split channel Eprom Mizutani prior cell with sidewall spacer forming the floating gate.

Another prior art split channel Eprom device which attempts to achieve the objective of accurately establishing L1 and L2 is disclosed by Y. Mizutani and K. Makita in the 1985 *IEDM Technical Digest*, p. 63, shown in cross section in FIG. 4c. Transistor 400c has a floating gate 404c formed along the sidewall 440c of control gate 409c. In this way both L1 and L2 can be independently established and are not sensitive to mask misalignment. Transistor 400c has the drawback that the capacitive coupling between control gate 409c and floating gate 404c is limited to the capacitor area of the sidewall shared between them, which is relatively a small area. Therefore there is a very weak capacitive coupling between the control gate and the floating gate either during programming or during read. Therefore, although the device achieves good control of L1 and L2 it is of rather low efficiency for both modes of operation.

Figure 4D:
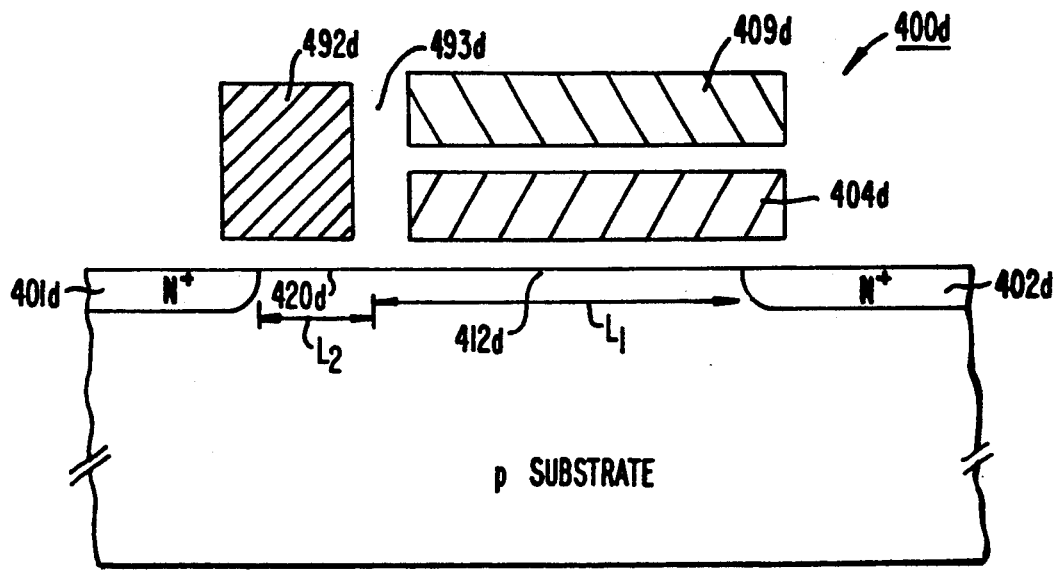
FIG. 4d is a cross section view of the split channel Eprom Wu prior art cell with sidewall spacer forming one of two floating gates.

Yet another prior art device which has a split channel with a well controlled L1 and L2 is disclosed by A. T. Wu et al. in the 1986 *IEDM Technical Digest*, p. 584 in an article entitled "A Novel High-Speed, 5-Volt Programming Eprom Structure with Source-Side Injection". A cross section of the Wu prior art transistor is shown in FIG. 4d (FIG. 2 in the above-referenced article). This transistor has a floating gate 404d coupled to a control gate 409d, extending over channel region L1 (412d), in series with a second floating gate 492d formed in a sidewall adjacent to source diffusion 401d and overlying channel region L2 (420d). This second floating gate is capacitively coupled to the control gate 409d through the relatively small area of the sidewall 493d shared between them and is therefore only marginally better than the Mizutani prior art device, although it does achieve a good control of both L1 and L2.

Figure 4E:
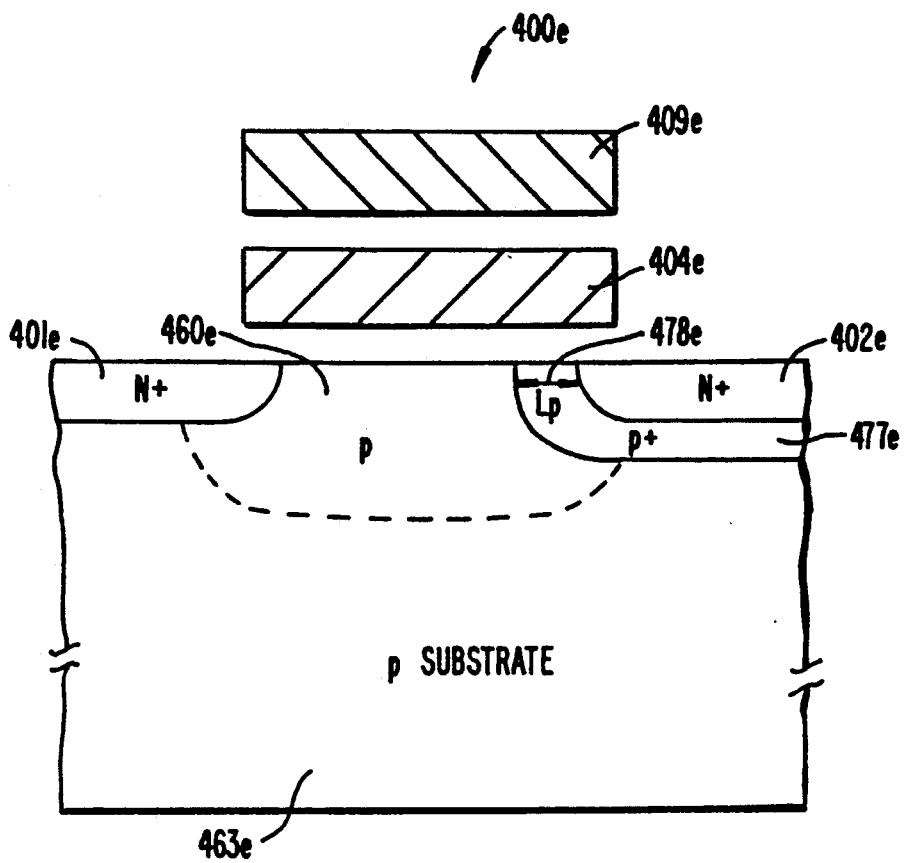
FIG. 4e is a cross section view of a stacked gate Eprom Tanaka prior art cell with heavily doped channel adjacent to the drain junction.

Another prior art Eprom transistor which does not have a split channel structure but which seeks to achieve two distinct channel regions to optimize the Eprom programming performance is disclosed by S. Tanaka et al. in 1984 *ISSCC Digest of Technical Papers*, p. 148 in an article entitled "A Programmable 256K CMOS Eprom with On Chip Test Circuits". A cross section of this device is shown in FIG. 4e (corresponding to FIG. 3 in the Tanaka article). Transistor 400e is a stacked gate Eprom transistor (not split channel) with source 401e and drain 402e self aligned to both edges of floating gate 404e and control gate 409e. The channel region is more heavily p doped 460e than the p substrate 463e, but in addition there is a second p+ region 477e which is even more heavily p-doped than region 460e. This region 477e is formed by diffusion of boron down and sideways from the top surface on the drain side only, and is formed after formation of the floating gate so as to be self aligned to the floating gate on the drain side. The extent of sideway diffusion of boron ahead of the sideway diffussion of arsenic from the N+ drain junction defines a channel region Lp (478e) adjacent to the drain. This is a DMOS type structure, called DSA (Diffusion Self Aligned) by Tanaka. The presence of the p+ region 478e reduces considerably the width of the drain depletion region during high voltage programming. A shorter depletion layer width results in greater energy being imparted to channel electrons entering the depletion region, which in turn results in significant increase in programming efficiency through hot electron injection. Transistor 400e has proven difficult to manufacture because it is rather difficult to control the length Lp and the surface channel concentration p+ through a double diffusion step. Furthermore, it is rather difficult to obtain value of Lp bigger than approximately 0.3 microns by diffusion because device scaling dictates the use of rather low temperature diffusion cycles. Still further, the DSA Eprom device suffers from an excessively high transistor threshold voltage in the unprogrammed (conducting) state, as well as from high drain junction capacitance. Both these effects can increase substantially the read access time.

DETAILED DESCRIPTION OF SPECIFIC EMBODIMENTS OF THE INVENTION

Figure 5A:
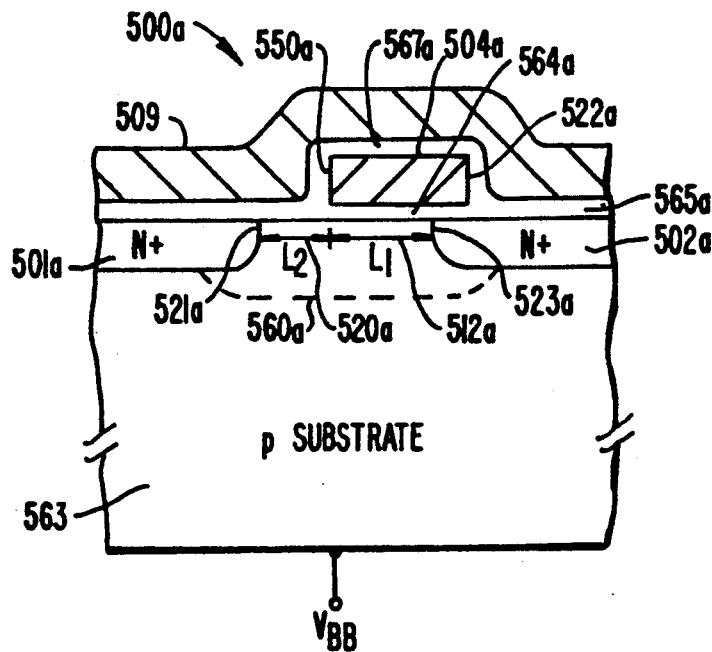
FIG. 5a is a cross section of a split channel Eprom cell in accordance with this invention.

I.a. Split Channel Eprom Transistor with Self Aligned Drain Diffusion and Self Aligned Spaced Apart Source Diffusion FIG. 5a presents a cross sectional view of a split channel Eprom transistor in accordance with a first embodiment of this invention. Transistor 500a consists of a p type silicon substrate 563 (which can alternatively be a p type epitaxial layer grown on top of a p++ doped silicon substrate), N+ source diffusion 501a, N+ drain diffusion 502a, a channel region 560a which is more heavily p-doped than the surrounding substrate, a floating gate 504a overlying a portion L1 of the channel, 512a, and a control gate 509 overlying the remaining portion L2 of the channel, 520a as well as the floating gate. Floating gate 504a is dielectrically isolated from the surface of the silicon substrate by dielectric film 564a, which is thermally grown Silicon Dioxide. Control gate 509 is capacitively coupled to floating gate 504a through dielectric film 567a, which can either be thermally grown Silicon Dioxide or a combination of thin layers of Silicon Dioxide and Silicon Nitride. Control gate 509 is also insulated from the silicon surface in channel portion L2 as well as over the source and drain diffusions by dielectric film 565a, which is made of the same material as dielectric 567a.

P-type substrate 563 is typically 5 to 50 Ohms centimeter, p+ channel doping 560a is typically in the range of $1 \times 10^{16}$ cm$^{-3}$ to $2 \times 10^{17}$ cm$^{-3}$, dielectric film 564a is typically 20 to 40 nanometers thick, dielectric film 567a is typically 20 to 50 nanometers thick, floating gate 504a is usually a heavily N+ doped film of polysilicon of thickness which can be as low as 25 nanometers (this thickness will be discussed in Section VII) or as high as 400 nanometers. Control gate 509 is either a heavily N+ doped film of polysilicon or a low resistivity interconnect material such as a silicide or a refractory metal. Of importance, edge 523a of N+ drain diffusion 502a formed by ion implantation of Arsenic or Phosphorus is self aligned to edge 522a of floating gate 504a, while edge 521a of N+ source diffusion 501a formed by the same ion implantation step is self aligned to, but is spaced apart from edge 550a of the same floating gate 504a, using a sidewall spacer (not shown in FIG. 5a) which is removed after the ion implantation but prior to formation of control gate 509. The implant dose used to form diffusions 501a, 502a, is typically in the range of $1 \times 10^{15}$ cm$^{-2}$ to $1 \times 10^{16}$ cm$^{-2}$.

Figure 5B:
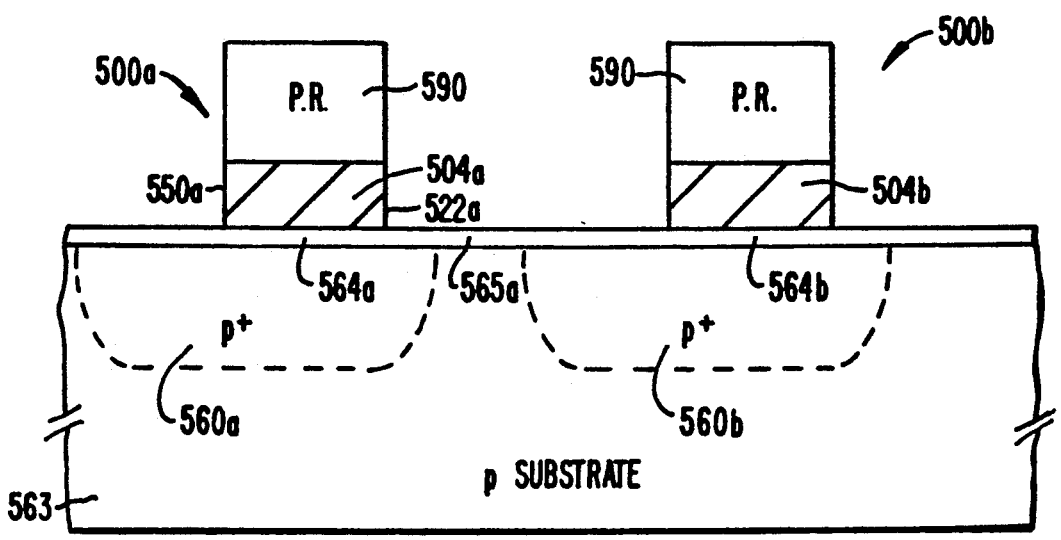
FIGS. 5b through 5f are cross sections of the cell of FIG. 5a during various stages in the manufacturing process.
Figure 5C:
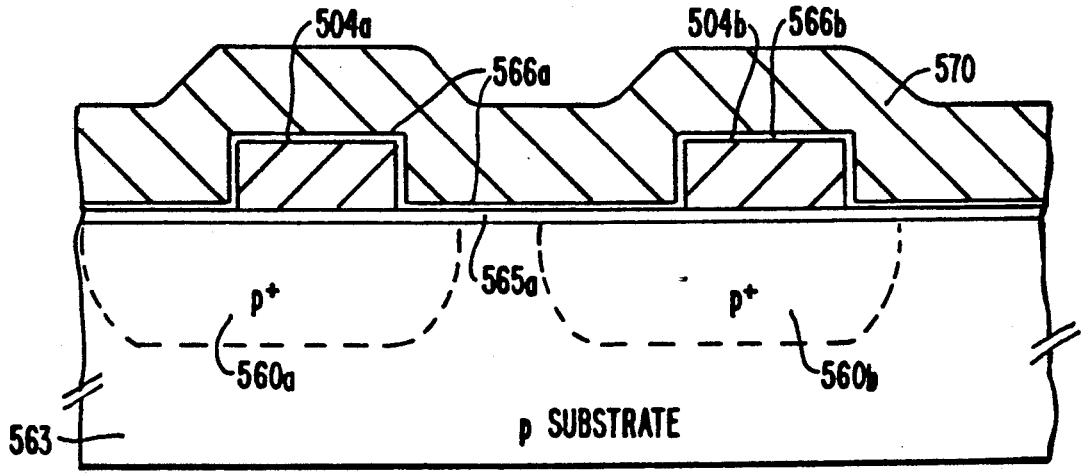

The key steps for the formation of channel portions L1 and L2 are illustrated in FIGS. 5b through 5f. In the structure of FIG. 5b floating gates 504a, 504b are formed in a layer of N+ doped polysilicon on top of a thin gate oxide 564a, by anisotropic reactive ion etchings, using photoresist layer 590 as a mask. In FIG. 5c a thin protective film 566a is deposited or thermally grown, followed by the deposition of a thick spacer layer 570. The purpose of film 566a is to protect the underlying structure such as layer 565a from being etched or attacked when the spacer film is etched back. The spacer film is now etched back in an anisotropic reaction ion etch step with carefully controlled timing. The conditions for etchback must have no significant undercutting and must have a differential etch rate of 20:1 or higher between the spacer material and the material of protective film 566a. Spacer layer 570 can be a conformal film of undoped LPCVD polysilicon while protective film 566a can be silicon dioxide or silicon nitride. Alternatively, spacer layer 570 can be a conformal film of LPCVD silicon dioxide while protective film 566a can be either LPCVD silicon nitride or LPCVD polysilicon. The thickness of protective film 566a should be as thin as possible, typically in the range of 10 to 30 nanometers, so as to to allow penetration of the subsequent Arsenic implantation to form the source and drain diffusions.

The thickness of the conformal spacer layer determines the width of the sidewall spacer, and therefore also the length of channel portion L2. Typically for an L2 of 400 nanometers a spacer layer of approximately 600 nanometers thickness is used.

Figure 5D:
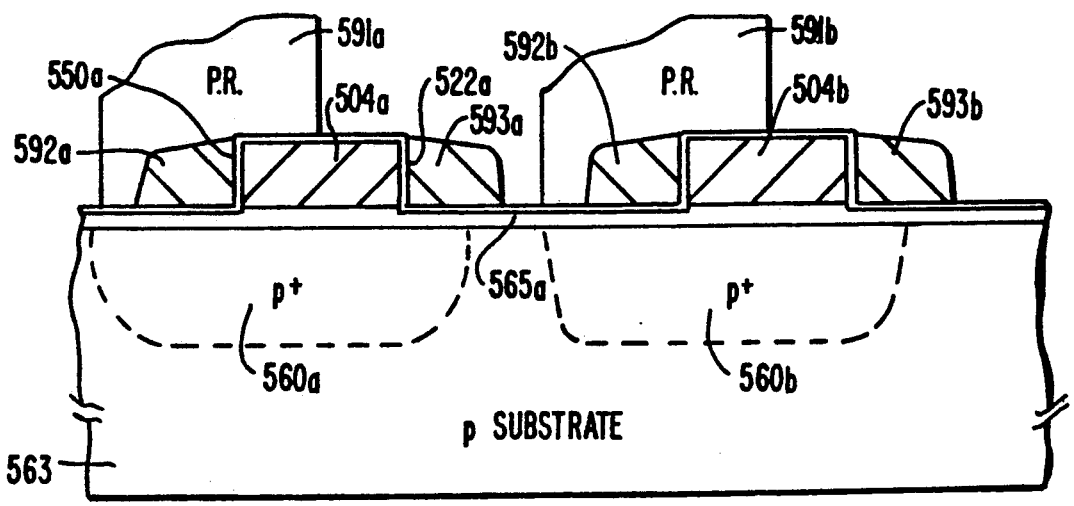

In FIG. 5d spacers 592a, 593a and 592b, 593b are formed along the vertical edges of floating gates 504a and 504b respectively at the completion of the timed reactive ion etch step. These spacers result from the fact that the thickness of layer 570 is greater adjacent to the vertical walls of the floating gates than it is on flat surfaces. Therefore a carefully timed anisotropic reactive ion etchback will etch through layer 570 in areas of flat surface topology while not completely etching through it along each edge, forming the spacers. The technique for formation of narrow sidewall spacers along both edges of the gate of MOS transistors is well known in the industry, and is commonly used to form lightly doped drains (LDD) in short channel MOSFETS. (See, for example, FIG. 1 in an article in 1984 *IEDM Technical Digest*, p. 59 by S. Meguro et al. titled "Hi-CMOS III Technology".)

In the present invention, the spacer can significantly wider, it is used along one edge only, and it is used not to define a lightly doped source or drain but rather to define the series enhancement transistor channel portion L2.

The next step is a masking step. Photoresist 591a, 591b (FIG. 5d) is used as a mask to protect spacers 592a, 592b while exposing spacers 593a, 593b. The latter are etched away, preferably with a wet chemical etch (which should be chosen so as to not etch protective film 566a), and the photoresist is stripped.

Figure 5E:
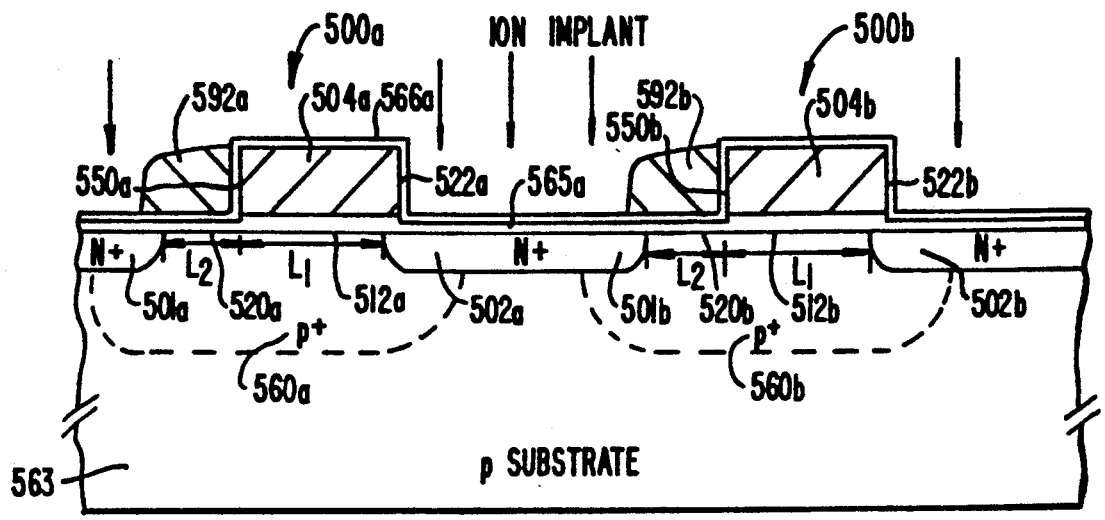

In FIG. 5e ion implantation of Arsenic through dielectric films 566a and 565a is used to form N+ source diffusions 501a, 501b and N+ drain diffusions 502a, 502b. On the drain side these diffusions are self aligned to edges 522a and 522b of the floating gates. On the source side the diffusions are self aligned to edges 550a and 550b of the floating gates but are spaced apart from these edges by the width of spacers 592a and 592b less the sideways diffusion in subsequent high temperature process steps.

Next, spacers 592a, 592b and the protective film 566a are removed (FIG. 5f), preferably with wet etches which will not attack the underlying layers 565a and 504a. Dielectric film 567a is grown by thermal oxidation or deposited by LPCVD on the exposed surfaces of the floating gates and substrate. A conductive layer is then deposited and control gates 509a, 509b are formed through etching of long narrow strips which constitute the word lines in rows of memory cells in an array.

The remaining part of the process is standard:

The surface of the structure is covered with a thick passivation layer 568, usually phosphorous doped glass or a Borophosphosilicate glass (BPSG). This passivation is made to flow in a high temperature anneal step. Contact vias are etched (not shown in FIG. 5f) to allow electrical access to the source and drain diffusions. Metallic interconnect strips 569a, 569b are provided on top of passivation layer 568, accessing the source and drain diffusions through the via openings (not shown).

Figure 5F:
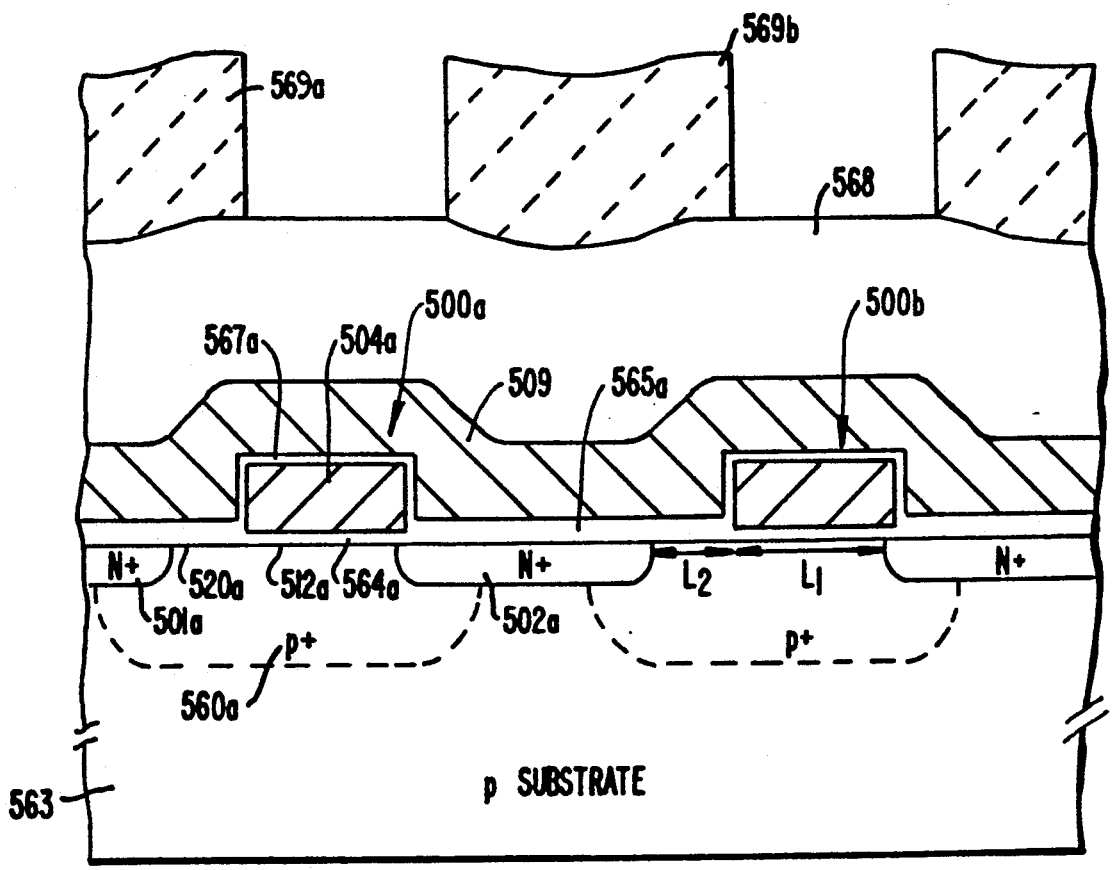

Comparing split channel transistor 500a of FIG. 5f with the Samachisa, Masuoka, Harari and Eitan prior art split channel transistors 100, 300, 300d and 400, the advantages of transistor 500a can be summarized as follows:

a) L1 and L2 are insensitive to mark misalignment. Therefore they can be controlled much more accurately and reproducibly than the prior art.

b) Because all four prior art transistors 100, 300, 300d and 400 define L2 through a mask alignment tolerance whereas transistor 500a defines L2 through control of the width of a sidewall spacer it is possible in transistor 500a to achieve controllably a much shorter channel portion L2 than possible through a mask alignment. This becomes an important consideration in highly scaled split channel Eprom and Flash EEprom transistors.

Figure 14A:
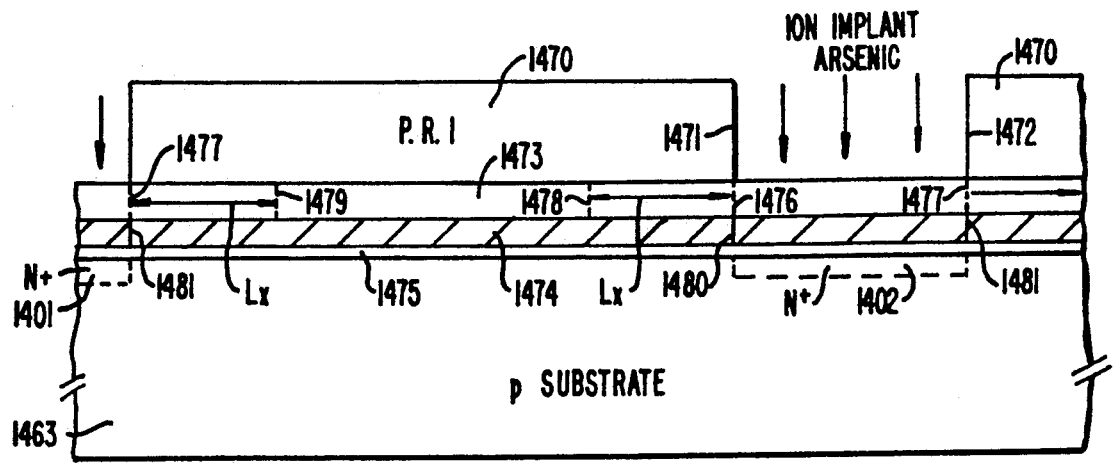
FIGS. 14a, 14b and 14c are cross sections of another embodiment of this invention during critical steps in the manufacturing flow.
Figure 14B:
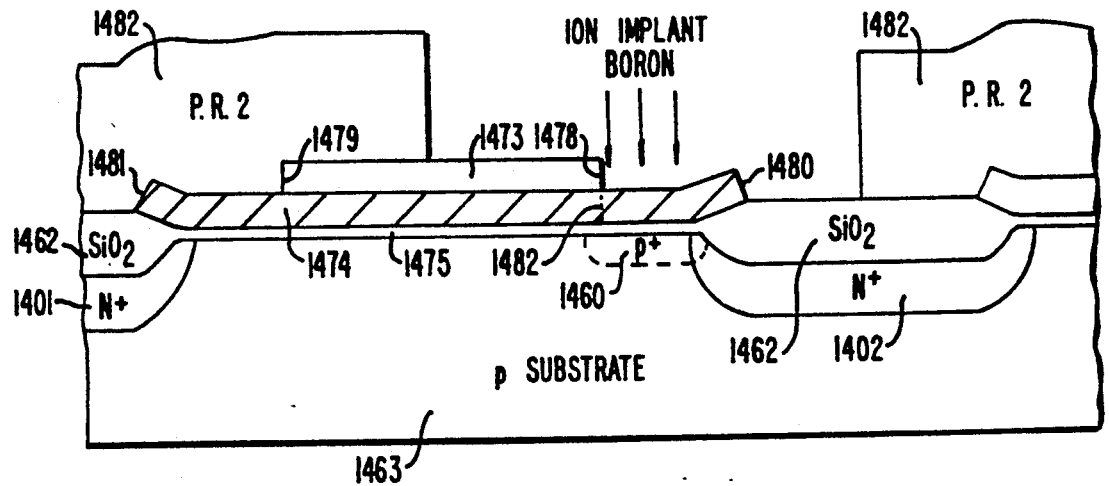
Figure 14C:
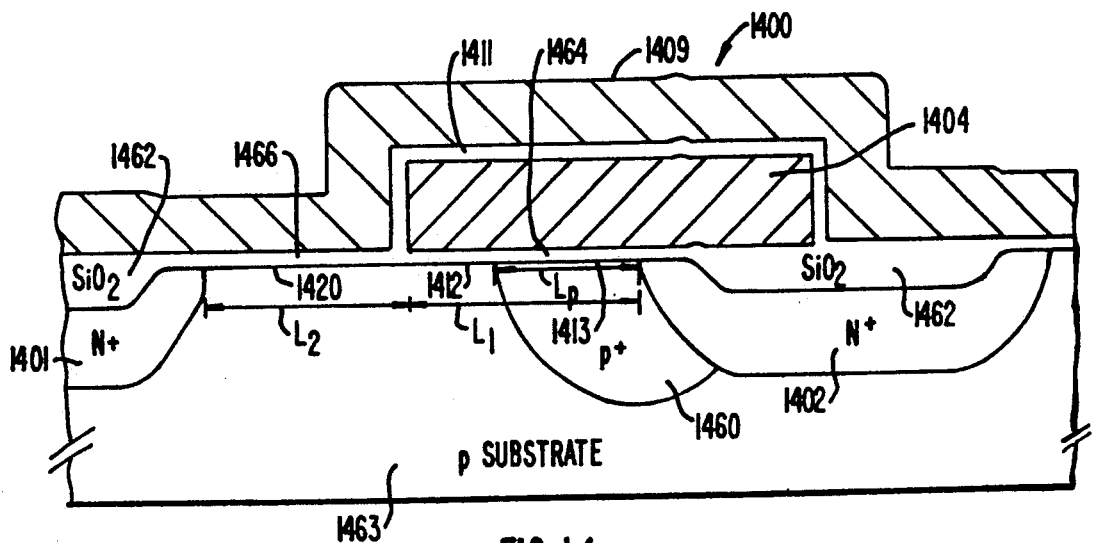

I.B. Split Channel Eprom Transistor with Heavily Doped Channel Adjacent to the Drain Junction FIG. 14c presents a cross sectional view of a non self aligned split channel Eprom transistor in accordance with a second embodiment of this invention. FIGS. 14a and 14b illustrate the critical process steps in the manufacturing process of this device. Transistor 1400 consists of a p type silicon substrate 1463 (which can also be a p type epitaxial layer grown on a p++ substrate). Shallow N+ source diffusions 1401 and N+ drain diffusions 1402 are formed prior to formation of floating gate 1404, in contrast with the embodiment of section Ia above. The channel region between the source and drain diffusions is split into two portions: a portion L1 (1412) which is lying directly underneath the floating gate, and a portion L2 (1420) which is lying directly underneath the control gate 1409. The improvement over the Harari prior art split channel transistor 300d (FIG. 3d) consists of a heavily p+ doped narrow region 1460 adjacent to drain diffusion 1402. The width Lp (1413) and doping concentration of this region at the top surface where the field effect transistor channel is formed, become the controlling parameters for device programming and reading efficiency, provided that p+ is sufficiently high. Typically, p substrate 1463 may have a p type doping concentration of $1 \times 10^{16}$ cm$^{-3}$ whereas p+ region 1460 may have a p+ type doping concentration of between $1 \times 10^{17}$ cm$^{-3}$ and $1 \times 10^{18}$ cm$^{-3}$. In the preferred manufacturing process the length Lp and doping concentration of region 1460 are chosen so that the depletion region width at the drain junction under programming voltage conditions is less than the width Lp. So long as that condition is satisfied, and so long as L1 is bigger than Lp, then the actual value of L1 is of secondary importance to the device performance. Since L1 in this device is determined through a mask alignment between the floating gate and the drain it is not as well controlled as in the Eitan prior art transistor 400. However, to the extent that region 1460 can be made to be self aligned to the drain so that parameter Lp is not sensitive to mask alignment, then any variability in L1 is of secondary importance, Lp being the controlling parameter.

A new method is disclosed for manufacturing the split channel Eprom transistor 1400 which results in much better control of the parameter Lp and of the surface channel doping concentration 1413 than is provided by the DSA (Diffusion Self Align) approach of the Tanaka prior art transistor 400e (FIG. 4e).

The main steps in this new method for the fabrication of a memory array of transistors 1400 are as follows:

1. In the structure of FIG. 14a a thin oxide layer 1475, typically 50 nanometers of silicon dioxide, is covered with a layer 1474 of silicon nitride, approximately 100 nanometers thick. This in turn is covered with a second layer 1473 of deposited silicon dioxide, approximately 100 nanometers thick. Oxide 1475 and nitride 1474 can, for example, be the same films used to form isoplanar isolation regions in the periphery of the memory array.

2. A photoresist mask P.R.1 (1470) is used to define source and drain regions in long parallel strips extending in width between edges 1471, 1472 of openings in the photoresist. Exposed oxide layer 1473 is now wet etched in a carefully controlled and timed etch step which includes substantial undercutting of photoresist 1470. The extent of undercutting, which is measured by the distance Lx between oxide edges 1476 and 1478, will eventually determine the magnitude of parameter Lp. Typically, Lx is chosen between 300 nanometers and 700 nanometers. The three parameters critical for a reproducible Lx are the concentration and temperature of the etch solution (hydrofluoric acid) and the density (i.e., lack of porosity) of the oxide 1473 being etched. These can be well controlled sufficiently so that a timed undercutting etch step results in well controlled etched strips of width Lx and running parallel to edges 1471, 1472 of the long openings in the photoresist. In fact, for values of Lx below approximately 500 nanometers, it is easier to achieve a reproducible Lx through controlled sideway etching than by controlling the line width of long, narrow line in a photoresist layer. An example of the use of sideway etching self aligned to an edge in a similar fashion (but to achieve the different purpose of forming a very narrow guard ring) can be found in the prior art article by S. Kim titled "A Very Small Schottky Barrier Diode with Self-Aligned Guard Ring for VLSI Application", appearing in the 1979 *IEDM Technical Digest*, p. 49.

3. At the completion of the sideway etch step a second, anisotropic etch is performed, using the same photoresist mask P.R.1 to etch away long strips of the exposed silicon nitride film 1474. Edges 1471, 1472 of P.R.1 (1470) are used to form edges 1480, 1481 respectively in the etched strips of nitride layers.

4. Arsenic ion implantation with an ion dose of approximately $5 \times 10^{15}$ cm$^{-2}$ is performed with an energy sufficient to penetrate oxide film 1475 and dope the surface in long strips of N+ doped regions (1402, 1401). Photoresist mask P.R.1 can be used as the mask for this step, but nitride layer 1474 can serve equally well as the implant mask. P.R.1 is stripped at the completion of this step.

5. An implant damage anneal and surface oxidation step follows, resulting in 200 to 300 nanometers of silicon dioxide 1462 grown over the source and drain diffusion strips. The temperature for this oxidation should be below 1000° C. to minimize the lateral diffusion of the N+ dopants in regions 1402, 1401. If desired it is possible through an extra masking step to remove nitride layer 1474 also from the field regions between adjacent channels, so as to grow oxide film 1462 not only over the source and drain regions but also over the field isolation regions.

6. In FIG. 14b a second photoresist mask P.R.2 (1482) is used to protect the source-side (1401) of the substrate during the subsequent implant step. This implant of boron can be performed at relatively high energy sufficient to penetrate through nitride layer 1474 and oxide layer 1475 but not high enough to penetrate top oxide 1473, nitride 1474 and oxide 1475. Alternatively, nitride layer 1474 can first be etched along edge 1482, using edge 1478 of the top oxide 1473 as a mask. The boron implant dose is in the range of $1 \times 10^{13}$ cm$^{-2}$ and $1 \times 10^{14}$ cm$^2$. The surface area of heavy p+ doping 1460 is confined to the very narrow and long strip of width extending between edge 1478 of the top oxide and the edge of the N+ diffusion 1402, and running the length of the drain diffusion strip. Note that the thick oxide 1462 prevents penetration of the boron implant into the drain diffusion strip. This greatly reduces the drain junction capacitance, which is highly desirable for fast reading. Note also that p+ region 1460 is automatically self aligned to drain region 1402 through this process.

7. Top oxide 1473, nitride 1474 and thin oxide 1475 are now removed by etching. This etching also reduces the thickness of the oxide layer 1462 protecting the source and drain diffusions. It is desirable to leave this film thickness at not less than approximately 100 nanometers at the completion of this etch step.

8. The remaining steps can be understood in relation to the structure of FIG. 14c: A gate oxide 1464 is grown over the surface, including the channel regions, separating between the long source/drain diffusion strips (typical oxide thickness between 15 and 40 nanometers). A layer of polysilicon is deposited (thickness between 25 and 400 nanometers), doped N+, masked and etched to form continuous narrow strips of floating gates 1404 mask aligned to run parallel to drain diffusion strips 1402 and to overlap p+ regions 1460.

9. A second dielectric 1466, 1411 is grown or deposited on top of the substrate and floating gate strips, respectively. This can be a layer of silicon dioxide or a combination of thin films of silicon dioxide and silicon nitride, of combined thickness in the range between 20 and 50 nanometers.

10. A second layer of polysilicon is deposited, doped N+ (or silicided for lower resistivity), masked and etched to form control gates 1409 in long strips running perpendicular to the strips of floating gates and source/drain strips. Each control gate strip is capacitively coupled to the floating gate strips it crosses over through dielectric film 1411 in the areas where the strips overlap each other. Control gates 1409 also control the channel conduction in channel portions L2 not covered by the floating gate strips. Each strip of control gates is now covered by a dielectric isolation film (can be thermally grown oxide).

11. Using the strips of control gates as a mask, exposed areas of dielectric 1466, 1411 and of the strips of first polysilicon floating gates are etched away. The resulting structure has long strips, or rows, of control gates, each row overlying several floating gates 1404 where the outer edges of each floating gate are essentially self aligned to the edges defining the width of the control gate strip. These edges are now oxidized or covered with a deposited dielectric to completely insulate each floating gate. Field areas between adjacent rows of cells or between adjacent strips of source and drain regions are now automatically self aligned to the active device areas and do not require space consuming isoplanar oxidation isolation regions. (Of course, it is also possible to fabricate transistor 1400 with source, drain and channel regions defined by the edges of a thick isoplanar oxidation isolation layer, or to rely for field isolation on oxide 1462 grown also in the field regions, see the option described in step 5 above.)

The Eprom cell of this embodiment has several advantages over the prior art Eprom cells:

a) Control gate 1409 now runs over a relatively thick oxide 1462 over the source and drain regions. Such a thick oxide is not possible for example with the prior art Eitan cell, where these source and drain regions are formed after, not before, the floating gate is formed. This improves the protection from oxide breakdowns and reduces the parasitic capacitance between control gate and drain.

b) Control of parameter Lp and of the surface P+ doping concentration in region 1460 is superior to that afforded by the DSA prior art Tanaka cell.

c) The device sensitivity to misalignment between floating gate and drain is far less than that experienced with the prior art Harari, Samachisa and Masuoka cells.

d) For a given p+ concentration in the channel region, drain junction capacitance is less with this cell than with all other prior art devices, because p+ region 1460 is very narrowly confined near the drain diffusion.

e) It is possible to dope p+ region 1460 to very high levels (which significantly enhances the programming efficiency) without unduly raising the conduction threshold voltage in the enhancement series channel region L2. This is particularly useful for Flash EEprom embodiments using this cell for the Eprom part. In such a Flash EEprom, the high initial threshold voltage in region Lp controlled by floating gate 1404 (initial Vt can be as high as +5.0V, the supply voltage, or higher), can be easily overcome by erasing the cell to lower threshold voltages. As an Eprom device the initial Vt in the unprogrammed state must not be higher than the control gate voltage during read, and this requirement sets an upper limit on how high the p+ doping concentration can be. Another limit on the magnitude of p+ doping concentration 1460 is established by the minimum drain voltage necessary for programming. The drain junction avalanche breakdown voltage must be at least as high as this minimum programming voltage.

II. Self Aligned Split Channel Flash EEprom Cell With Isoplaner Field Isolation

Figure 6A:
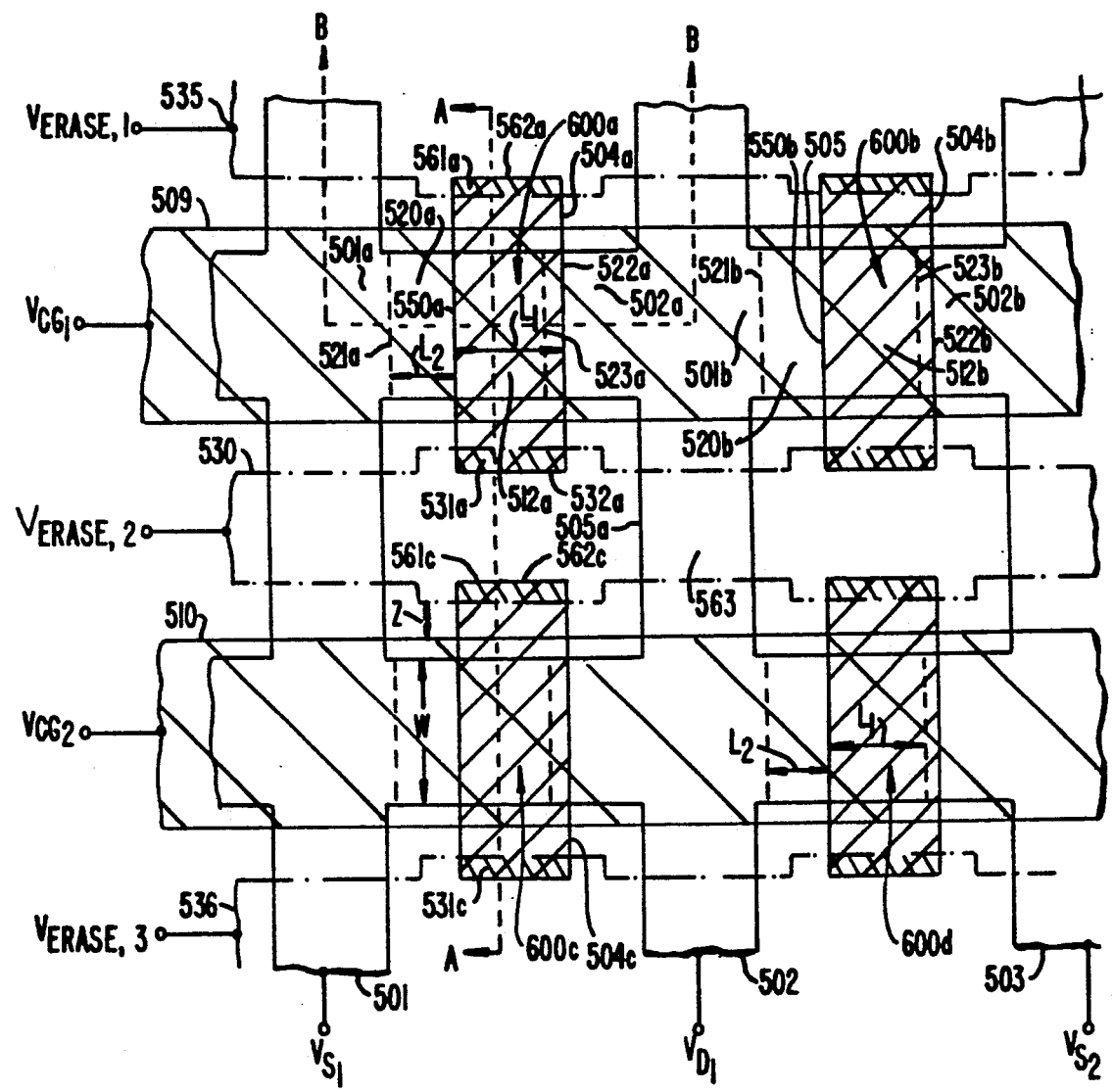
FIG. 6a is a top view of a 2×2 array of Flash EEprom cells formed in a triple layer structure in accordance with one embodiment of this invention.
Figure 6B:
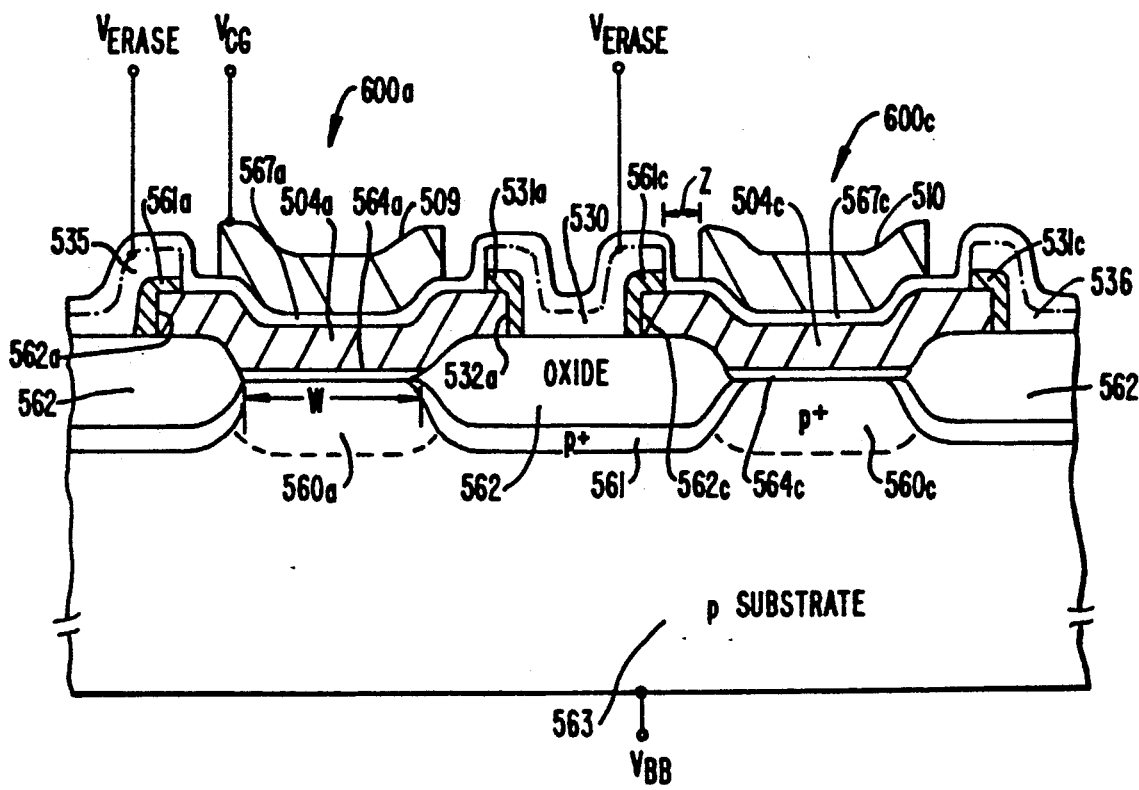

FIG. 6a presents a topological view of a 2×2 memory array consisting of four Flash EEprom transistors 600a, 600b, 600c and 600d in accordance with one embodiment of this invention. FIG. 6b presents a cross section view of the same structure along AA of FIG. 6a. A second cross section along BB results in the Eprom transistor 500a shown in FIG. 5a.

Transistor 600a of FIG. 6a is a split channel Eprom transistor which has added to it erase gates 530, 535, which overlap edges 532a, 562a of floating gate 504a. Transistor 600a is programmed as a split channel Eprom transistor having a source diffusion 501a, a drain diffusion 502a, and a control gate 509. Floating gate a and, channel portions L1 and L2 are formed in accordance with the split channel Eprom transistor 500a of section I.a. or the split channel Eprom transistor 1400 of section I.b. However other split channel Eprom devices (such as the Eitan, Harari, Masuoka or Samachisa prior art Eprom) can also be used for the Eprom structure. The transistor channel width W is defined by the edges 505, 505a of a thick field oxide 562.

Transistor 600a is erased by tunneling of electrons from floating gate 504a to erase gates 530, 535, across tunnel dielectrics 531a, 561a on the sidewalls and top surface of the floating gate where it is overlapped by the erase gate.

Tunnel dielectric film 531a, 561a is normally a layer of Silicon Dioxide grown through thermal oxidation of the heavily N+ doped and textured polycrystalline silicon comprising the floating gate. It is well known in the industry (see for example an article by H.A.R. Wegener titled "Endurance Model for textured-poly floating gate memories", *Technical Digest of the IEEE International Electron Device Meeting*, December 1984, p. 480) that such a film, when grown under the appropriate oxidation conditions over properly textured doped polysilicon allows an increase by several orders of magnitude of the conduction by electron tunneling even when the film is several times thicker than tunnel dielectric films grown on single crystal silicon (such as the tunnel dielectric films used in the prior art Samachisa and Kynett devices). For example, a tunnel dielectric oxide grown to a thickness of 40 nanometers on N+ doped and textured polysilicon can conduct by electronic tunneling approximately the same current density as a tunnel dielectric oxide of 10 nanometers thickness grown on N+ doped single crystal silicon under identical voltage bias conditions. It is believed that this highly efficient tunneling mechanism is a result of sharp asperities at the grain boundaries of the polysilicon which is specially textured to enhance the areal density of such asperities. A commonly practices technique is to first oxidize the surface of the polysilicon at a high temperature to accentuate the texturing, then stripping that oxide and regrowing a tunnel oxide at a lower temperature. The oxide film capping such an asperity experiences a local amplification by a factor of four to five of the applied electric field resulting in an efficient localized tunnel injector. The advantage provided by the thicker films of tunnel dielectric is that they are much easier to grow in uniform and defect-free layers. Furthermore the electric field stress during tunneling in the thick (40 nanometer) tunnel dielectric is only 25 percent of the stress in the thin (10 nanometer) tunnel dielectric, assuming the same voltage bias conditions. This reduced stress translates into higher reliability and greater endurance to write/erase cycling. For these reasons, all Flash EEprom embodiments of this invention rely on polypoly erase through a relatively thick tunnel dielectric.

In the embodiment of FIGS. 6a, 6b floating gate 504a is formed in a first layer of heavily N+ doped polysilicon of thickness between 25 and 400 nanometers, erase gates 530, 535 are formed in a second layer of N+ doped polysilicon of thickness between 50 and 300 nanometers, and control gate 509 is formed in a third conductive layer of thickness between 200 and 500 nanometers, which may be N+ doped polysilicon or a polycide, a silicide, or a refractory metal. The erase gate can be formed in a relatively thin layer because a relatively high sheet resistivity (e.g., 100 Ohm per square) can be tolerated since almost no current is carried in this gate during tunnel erase.

The manufacturing process can be somewhat simplified by implementing erase gates 530, 535 in the same conductive layer as that used for control gate 509. However the spacing Z between the edges of the control gate and the erase gate (and hence the cell size) would then have to be significantly greater than is the case when the control gate and erase gates are implemented in two different conductive layers insulated from each other. by dielectric film 567a. In fact, in the triple layer structure 600a of FIG. 6a it is even possible to have control gate 509 slightly overlap one or both of the erase gates 530 and 535 (i.e., spacing Z can be zero or negative.) Transistor 600a employs a field isolation oxide 562 (FIG. 6b) of thickness between 200 and 1000 nanometers. Gate oxide 564a protecting channel portion L1 (512a) is thermally grown silicon dioxide of thickness between 15 and 40 nanometers. Dielectric film 567a which serves to strongly capacitively couple control gate 509 and floating gate 504a is grown or deposited. It may be silicon dioxide or a combination of thin films of silicon dioxide and oxidized silicon nitride of combined thickness of between 20 and 50 nanometers. This dielectric also serves as part of the gate oxide protecting channel portion L2 (520a) as well as insulation 565a (FIG. 5a) over the source and drain diffusions. Erase dielectric 531a, 561a is thermally grown Silicon Dioxide or other deposited dielectrics possessing the appropriate characteristics for efficient erase conduction, such as Silicon Nitride. Its thickness is between 30 and 60 nanometers.

A point of significance is the fact that the tunnel dielectric area contributing to erase in each cell consisting of the combined areas of 531a and 561a, is insensitive to the mask misalignment between edges 532a, 562a of floating gate 504a and erase gates 530, 535. (Note that each erase gate, such as 535, is shared between two adjacent cells, such as 600a and 600c in this case). Any such misalignment will result in a reduction of the area of the tunnel dielectric at one edge of the floating gate, but also in an increase of equal magnitude in the area available for tunneling at the other edge of the floating gate. This feature permits the construction of a cell with very small area of tunnel dielectric. By contrast the prior art triple layer Flash EEprom cells of Masuoka and Kuo referenced above are sensitive to mask misalignment and therefore require a structure wherein the nominal area provided for tunnel erase may be much larger than the optimum such area, in order to accommodate for the worst case misalignment condition.

Another distinguishing feature of this embodiment relative to the Masuoka cell of FIGS. 3a and 3b is that Masuoka implements the erase gate in a first conductive layer 330 and the floating gate in a second conductive layer 304, i.e., in a reverse order to that used in this invention. This results in a far less efficient tunnel erase in the Masuoka cell because the asperities in Masuoka's tunnel dielectric 331 are at the surface of the erase gate (collector) rather than at the injecting surface of the floating gate. Therefore Masuoka's cell requires higher electric fields (and therefore higher $V_{ERASE}$ voltages) than the structure of this invention.

Typical bias voltage conditions necessary to erase memory cells 600a, 600b, 600c and 600d are:

$V_{ERASE}$ (on all erase gates 530, 535, 536)=15V to 25V applied for between 100 milliseconds and 10 seconds (the pulse duration is strongly dependent on the magnitude of $V_{ERASE}$), $V_{CG}=0V$, $V_{BB}=0V$. $V_D$ and $V_S$ can be held at 0V or at a higher voltage between 5V and 10V, so as to reduce the net voltage experienced during erase across dielectric film 565a in areas such as 563 (FIG. 6a) where erase gate 530 crosses over drain diffusion 502.

Figure 7A:
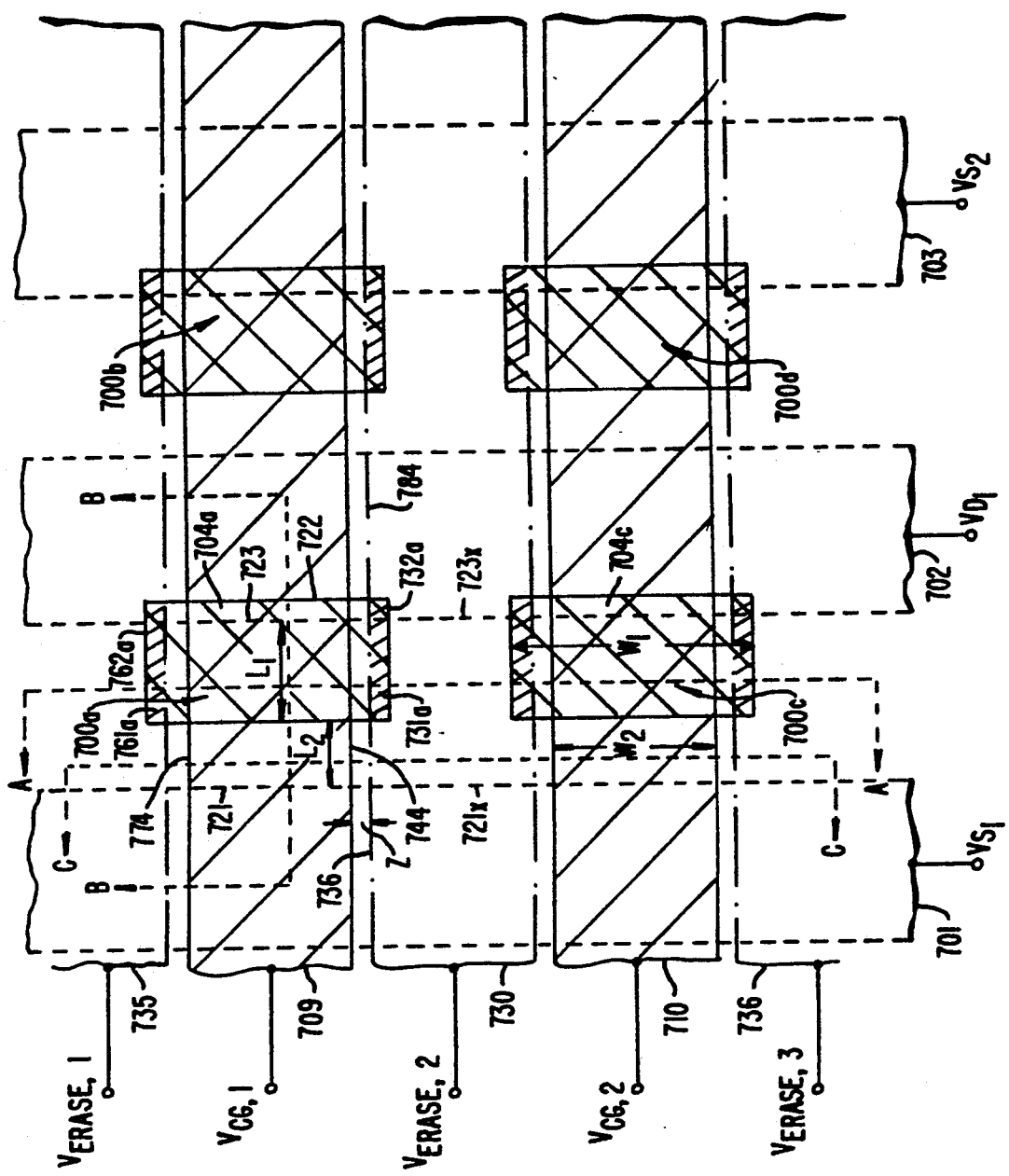
FIG. 7a is a top view of a 2×2 array of Flash EEprom cells formed in a triple layer structure in accordance with a second embodiment of this invention wherein the erase gates also provide field plate isolation.
Figure 7B:
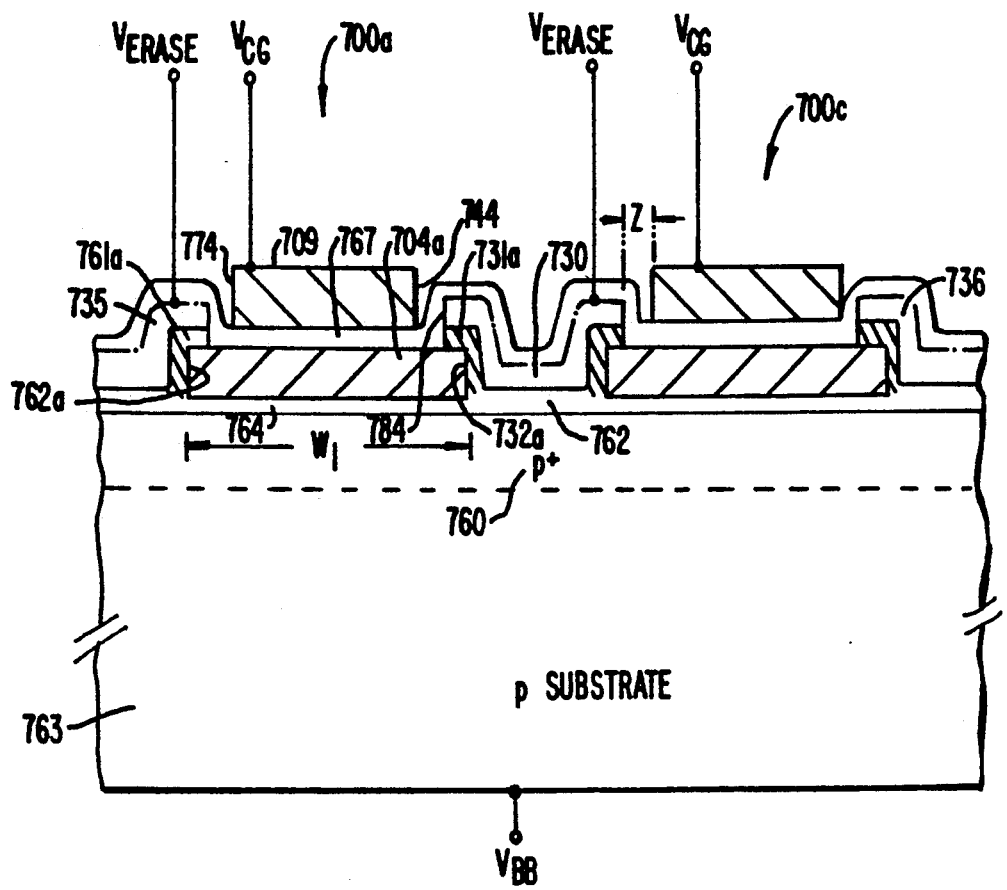

III. Self Aligned Split Channel Flash EEprom Cell With Field Plate Isolation A 2×2 array of Flash EEprom cells in accordance with another embodiment of this invention is shown in topological view in FIG. 7a and in two cross sectional views AA and CC in FIGS. 7b and 7c respectively. Cross sectional view BB is essentially the same as the split channel Eprom transistor of FIG. 5a.

Split channel Flash EEprom transistor 700a employs three conductive layers (floating gate 704 erase gates 730, 735 and control gate 709) formed in the same sequence as describe d in section II in conjunction with the Flash EEprom transistor 600a of FIGS. 6a, 6b. The major distinguishing feature of transistor 700a is that erase gates 730, 735, 736 are used not only for tunnel erase but also as the switched off gates of isolation field transistors formed outside the active transistor regions. Thus, the thick isoplaner isolation oxide 562 of cell 600a (FIG. 6b) is not necessary, and is replaced inside the array of memory cells 700a, 700b, 700c and 700d by a much thinner oxide 762 (FIGS. 7b, 7c) capped with field plates 730, 735, 736, which are held at 0V at all times except during erasing.

The elimination of the thick isoplanar oxide inside the array of memory cells (this isoplanar oxide may still be retained for isolation between peripheral logic transistors) has several advantages:

1. The surface stress at the silicon-silicon dioxide boundary due to a prolonged thermal isoplanar oxidation cycle is eliminated inside the array, resulting in less leaky source and drain junctions and in higher quality gate oxides.

2. For a given cell width, the elimination of the isoplanar oxide allows the effective channel width $W_1$ under floating gate 704 to extend all the way between the two edges 732a, 762a of the floating gate. By comparison, effective channel width W of transistor 600a (FIG. 6b) is determined by the edges 505 of the isoplanar oxide and is therefore substantially smaller. This difference results in a higher read signal for cell 700a, or a narrower, smaller cell.

3. From capacitive coupling considerations (to be discussed in section VI below) the efficiency of tunnel erase is higher in cells where coupling of the floating gate to the silicon substrate 763 is greatest. In transistor 700a the entire bottom surface area of the floating gate is tightly coupled to the substrate 763 through the thin gate dielectric 764. By contrast, in transistor 600a (FIG. 6b) much of the bottom surface area of floating gate 504a overlies the thick field oxide 562 and is therefore not strongly capacitively coupled to substrate 563.

Figure 7C:
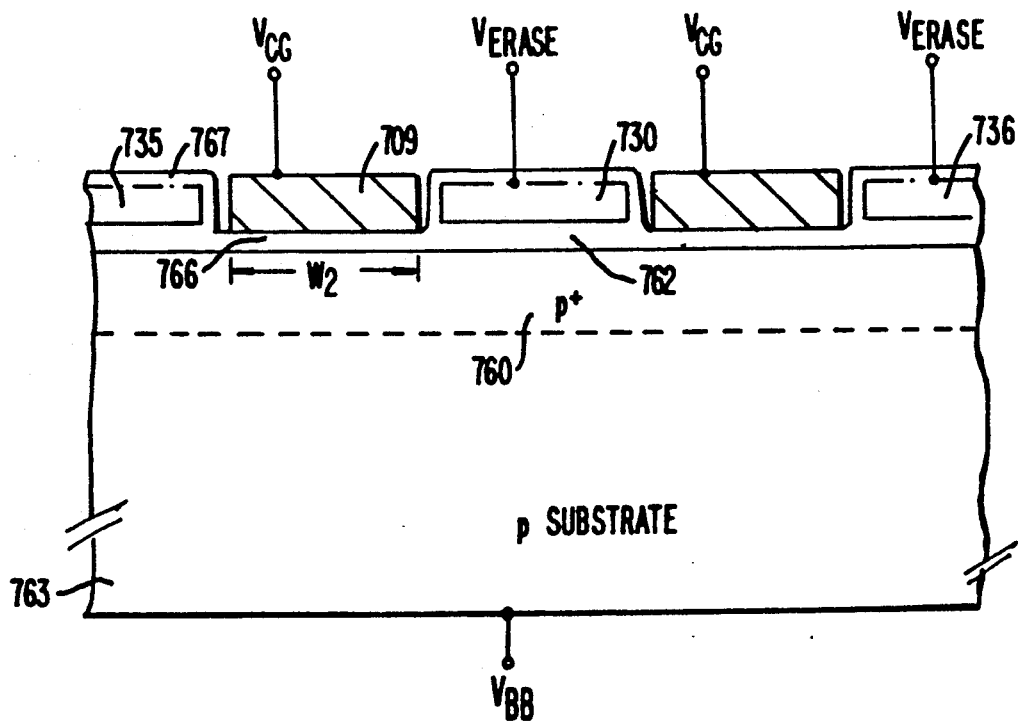

4. The width of control gate 709 between its edges 744 and 774 defines channel width $W_2$ of the series enhancement channel portion L2 (FIG. 7c). This permits the reduction in overall cell width due to removal of the requirement for the control gate to overlap the edges of the isoplaner oxide. One precaution necessary in the fabrication of cell 700a is that any misalignment between the mask layers defining edge 732a of floating gate 704a, edge 784 of erase gate 730, and edge 744 of control gate 709 must not be allowed to create a situation where a narrow parasitic edge transistor is created under control gate 709 in parallel with the split channel L1 and L2. However, as with cell 600a, since erase gates 730, 736 and control gate 709 are formed in two separate conductive layers which are isolated from each other by dielectric insulator film 767 (FIG. 7b) there is no requirement placed on the magnitude of the spatial separation Z between edge 784 and edge 744. In fact, the two edges can be allowed to overlap each other through oversizing or through misalignment, i.e., Z can be zero or negative. Dielectric insulator 767 also forms part of the gate dielectric 766 (FIG. 7c) over channel portion L2.

In a memory array source diffusion 701 and drain diffusion 702 can be formed in long strips. If transistor 500a is used as the Eprom transistor, then source diffusion edge 721 is self aligned to the previously discussed, sidewall spacer (not shown) while drain diffusion edge 723 is self aligned to edge 722 of floating gate 704a. In areas between adjacent floating gatens 704a, 704c the source and drain diffusion edges (721x, 723x in FIG. 7a) respectively must be prevented from merging with one another. This can be accomplished by for example first forming floating gates 704a, 704c as part of a long continuous strip of polysilicon, then using this strip with an associated long continuous strip of sidewall spacer to form by ion implantation long diffusion strips 701, 702, removing the spacer strip, and only then etching the long continuous strip of polysilicon along edges 732a, 762a to form isolated floating gates 704a, 704c. As with the prior Flash EEprom embodiment it is possible to form this embodiment also in conjunction with Eprom cell 1400 (FIG. 14c) or with any other prior art split channel Eproms so long as they do not have their isoplanar isolation oxide inside the memory array.

IV. Self Aligned Split Channel Flash EEprom Cell with Erase Confined to The Vertical Edges of The Floating Gate.

Figure 8A:
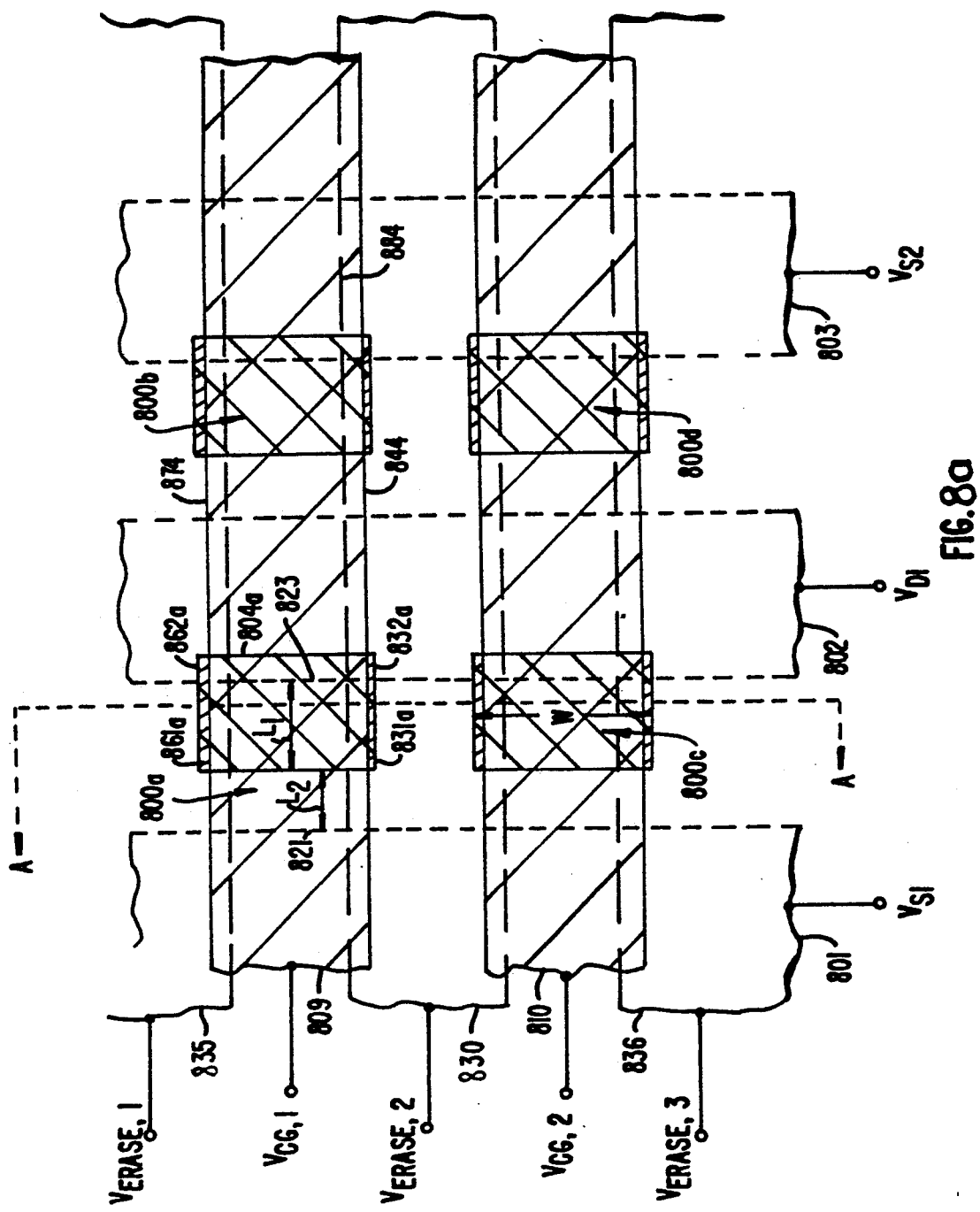
FIG. 8a is a top view of a 2×2 array of Flash EEprom cells formed in a triple layer structure in accordance with a third embodiment of this invention wherein the tunnel erase dielectric is confined to the vertical surfaces at the two edges of the floating gate.
Figure 8B:
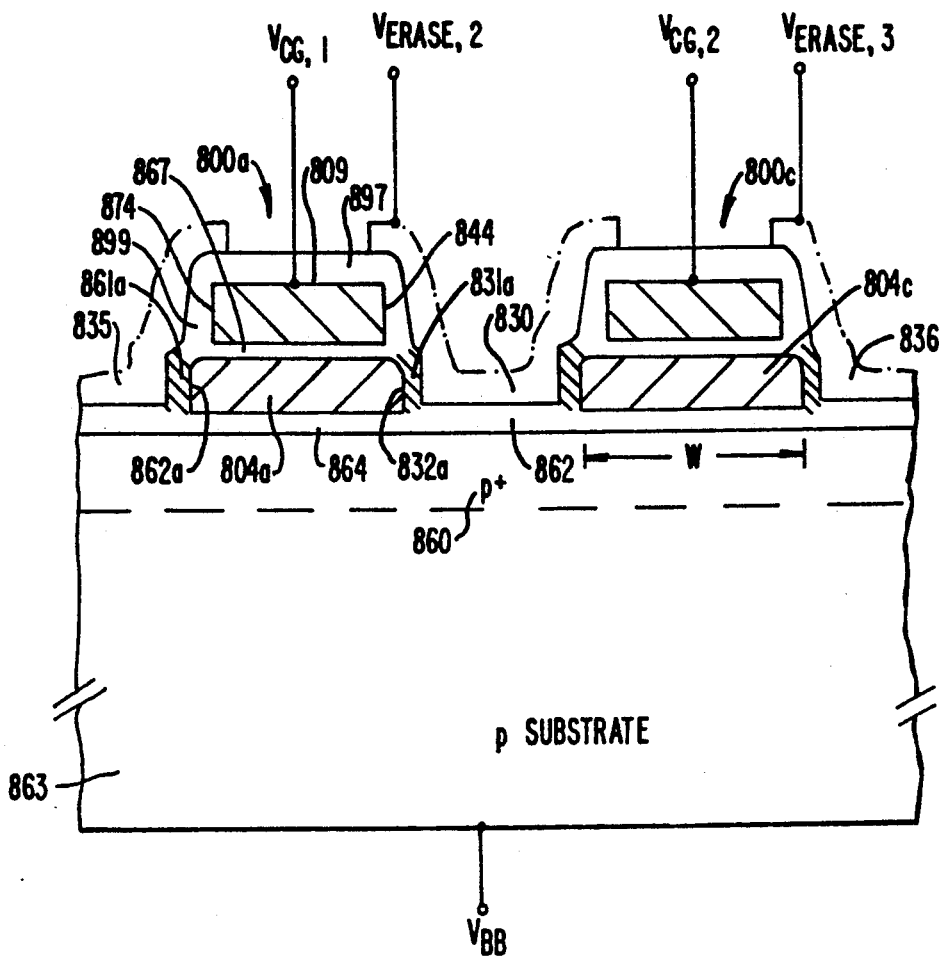

Another embodiment of the self aligned split channel Flash EEprom of this invention can result in a cell which has smaller area than cells 600a and 700a of the embodiments described in Sections II and III respectively. In this third embodiment the area for tunnel erase between the floating gate and the erase gate is confined essentially to the surfaces of the vertical sidewalls along the two edges of each floating gate. To best understand how cell 800a of this embodiment differs from cell 700a a 2×2 array of cells 800a, 800b, 800c and 800d are shown in FIG. 8a in topological view and in FIG. 8b along the same cross section direction AA as is the case in FIG. 7b for cells 700a, 700c.

Cell 800a has a floating gate 804a formed in a first layer of heavily N+ doped polysilicon. This gate controls the transistor conduction in channel portion L1 (FIG. 8a) through gate oxide insulation film 864. Control gate 809 is formed in the second conductive layer, and is insulated from the floating gate by dielectric film 867, which may be a thermally grown oxide or a combination of thin silicon dioxide and silicon nitride films. Edges 874, 844 of control gate 809 are used as a mask to define by self aligned etching the edges 862a, 832a respectively of floating gate 804a. Erase gates 830, 835 are formed in a third conductive layer and are made to overlap edges 832a, 862a of floating gate 804a. Each erase gate such as 830 is shared by two adjacent cells (such as 800a, 800c).

The erase gates are insulated from control gate 809 by dielectric insulator 897 which is grown or deposited prior to deposition of erase gates 830, 835, 836. Tunnel erase dielectrics 831a, 861a are confined to the surface of the vertical edges 832a, 862a of the floating gate 804a. Erase gate 830 also provides a field plate isolation over oxide 862 in the field between adjacent devices.

The thickness of all conducting and insulating layers in structure 800 are approximately the same as those used in structure 700a. However, because the erase gate is implemented here after, rather than before the control gate, the fabrication process sequence is somewhat different. Specifically (see FIGS. 8a, 8b):

1. Floating gates 804a, 804c are formed in long continuous and narrow strips on top of gate oxide 864. The width of each such strip is L1 plus the extent of overlap of the floating gate over the drain diffusion.

2. Dielectric 867 is formed and the second conductive layer (N+ doped polysilicon or a silicide) is deposited.

3. Control gates 809 are defined in long narrow strips in a direction perpendicular to the direction of the strips of floating gates. The strips are etched along edges 844, 874, and insulated with relatively thick dielectric 897.

4. Edges 844, 874 (or the edges of insulator spacer 899 formed at both edges of control gate strip 809) are then used to etch dielectric 867 and then, in a self aligned manner to also etch vertical edges 832a and 862a of the underlying floating gate strips, resulting in isolated floating gates which have exposed edges of polysilicon only along these vertical walls.

5. Tunnel dielectric films 831a, 861a are formed by thermal oxidation of these exposed surfaces.

6. A third conductive layer is deposited, from which are formed erase gates 830 in long strips running in between and parallel to adjacent strips of control gates. These erase gates also serve as field isolation plates to electrically isolate between adjacent regions in the memory array.

Flash EEprom transistor 800a can be implemented in conjunction with any of the split channel Eprom transistors of this invention (transistors 500a and 1400) or with any of the prior art split gate Eprom transistors of Eitan, Samachisa, Masuoka or Harari. For example, an array of Flash EEprom transistors 800a can be fabricated by adding a few process steps to the fabrication process for the split channel Eprom transistor 1400 (FIG. 14c), as follows:

Steps 1 through 10 are identical to steps 1 through 10 described in Section I.b. in conjunction with the manufacturing process for split channel Eprom transistor 1400.

Steps 11, 12, and 13 are the process steps 4, 5, and 6 respectively described in this section IV in conjunction with split channel Flash EEprom transistor 800a.

Cell 800a results in a very small area of tunnel erase, which is also relatively easy to control (it is not defined by a mask dimension, but rather by the thickness of the deposited layer constituting the floating gates). For this reason, this cell is the most highly scalable embodiment of this invention.

V. Self Aligned Split Channel Flash EEprom Cell With a Buried Erase Gate.

Figure 9A:
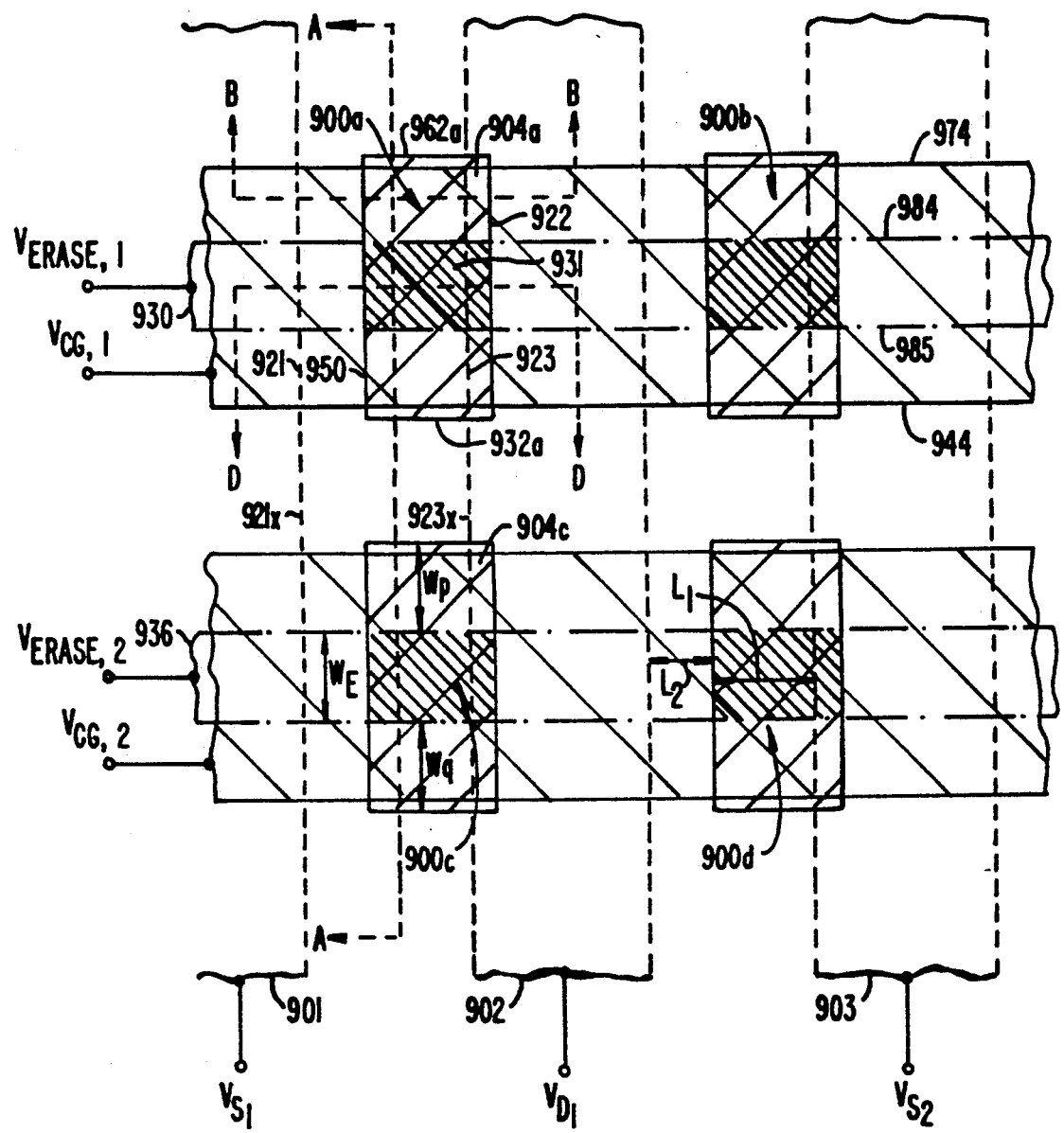
FIG. 9a is a top view of a 2×2 array of Flash EEprom cells formed in a triple layer structure in accordance with a fourth embodiment of this invention wherein the erase gate is sandwiched in between the floating gate and the control gate.
Figure 9B:
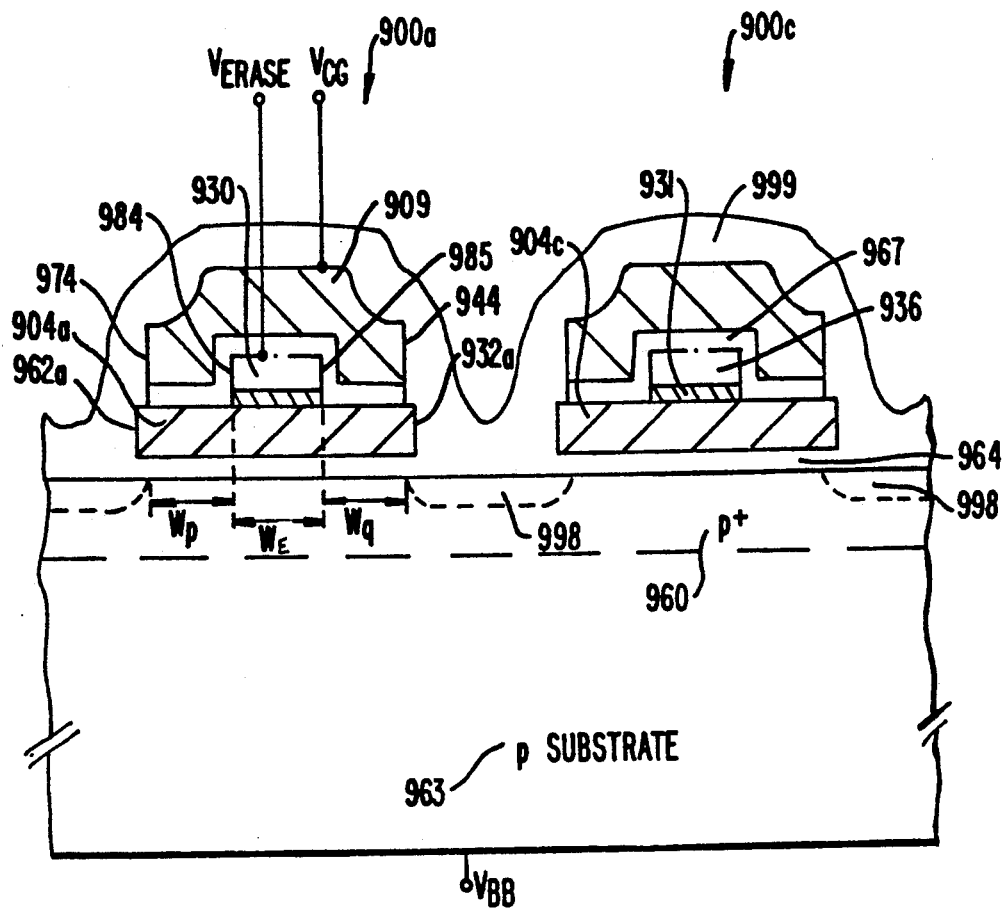
Figure 9C:
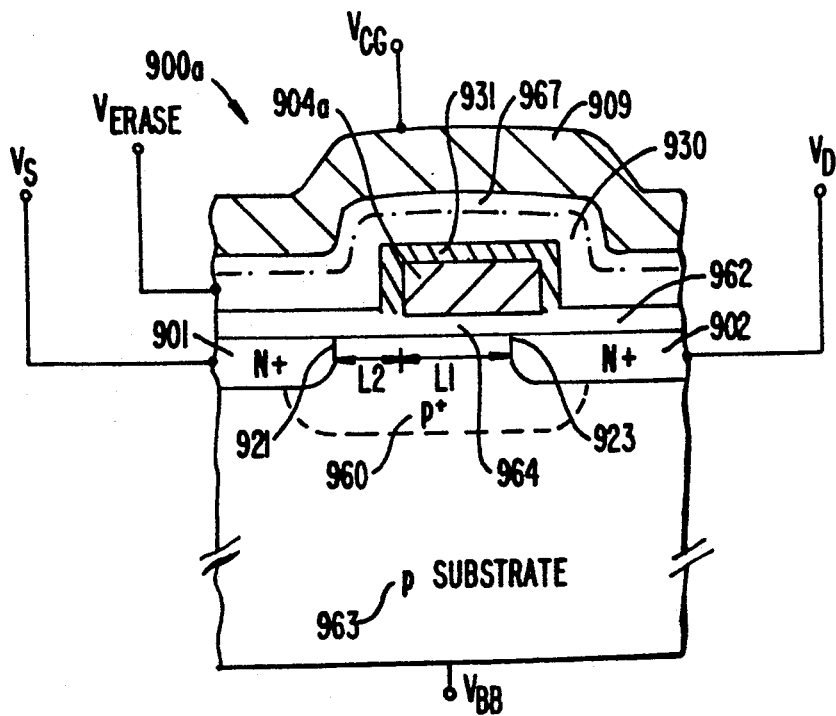

A 2×2 array of Flash EEprom cells 900a, 900b, 900c and 900d in accordance with a fourth embodiment of this invention is shown in topological view in FIG. 9a and in two cross sectional views AA and DD in FIGS. 9b and 9c respectively. Cross section BB of FIG. 9a yields the split channel Eprom structure 500a of FIG. 5a.

Transistor 900a is a split channel Flash EEprom transistor having channel portions L1 and L2 formed by self alignment as in Eprom transistor 500a or in a non self aligned manner as in Eprom transistor 1400. Erase gate 930 is a narrow conductive strip sandwiched between floating gate 904a on the bottom and control gate 909 on top. Erase gate 930 is located away from edges 932a, 962a of the floating gate. These edges therefore play no role in the tunnel erase, which takes place through tunnel dielectric 931 confined to the area where erase gate 930 overlaps floating gate 904a. Erase gate 930 also overlaps a width $W_e$ of the series enhancement channel portion L2. During read or programming, erase gate 930 is held at 0V, and therefore the channel portion of width $W_e$ does not contribute to the read or program current. The only contribution to conduction in channel portion L2 comes from widths $W_p$ and $W_q$ where the channel is controlled directly by control gate 909. Channel portion L1 however sees conduction contributions from all three widths, $W_p$, $W_q$ and $W_e$. Edges 932a, 962a of floating gate 904a can be etched to be self aligned to edges 944, 974 respectively of control gate 909. This then permits the formation of channel stop field isolation 998, by implanting a p type dopant in the field regions not protected by the control gate or floating gate (FIG. 9b).

One advantage of cell 900a is that erase gate strips 930, 936 can be made very narrow by taking advantage of controlled undercutting by for example isotropic etchings of the conductive layer forming these strips. This results in a small area of tunnel erase, which is insensitive to mask misalignment. Furthermore the channel width $W_p$ and $W_q$ is also insensitive to mask misalignment. This embodiment of Flash EEprom can also be implemented in conjunction with prior art split channel Eproms cells such as the Eitan, Harari, Samachisa or Masuoka cells.

VI. Device Optimization

Figure 10:
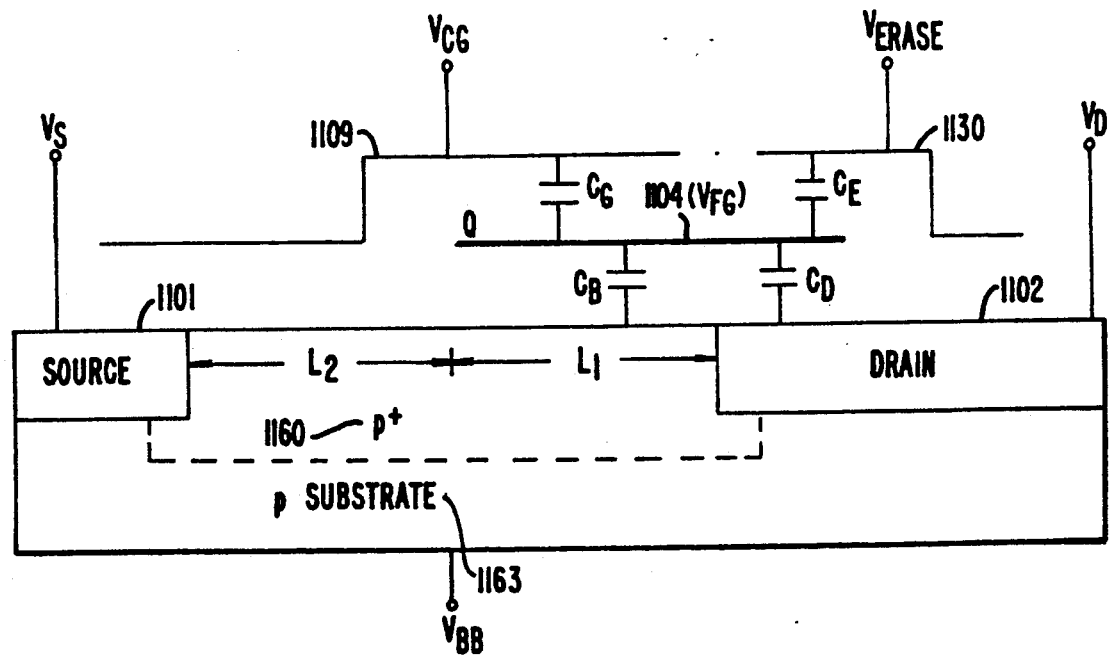
FIG. 10 is a schematic representation of the coupling capacitances associated with the floatings gate of the Flash EEprom cell of the invention.

FIG. 10 represents a schematic of the major capacitances which couple the floating gate of the split channel Flash EEprom cells of this invention to the surrounding electrodes.

Specifically these are:

$C_G$=Capacitance between Floating gate 1104 and control gate 1109.

$C_D$=Capacitance between Floating gate 1104 and drain diffusion 1102.

$C_B$=Capacitance between Floating gate 1104 and substrate 1163.

$C_E$=Capacitance between Floating gate 1104 and erase gate 1130.

$C_T = C_G + C_D + C_B + C_E$ is the total capacitance. Q is the net charge stored on the floating gate. In a virgin device, Q=0. In a programmed device Q is negative (excess electrons) and in an erased device Q is positive (excess holes).

The voltage $V_{FG}$ on Floating gate 1104 is proportional to voltages $V_{CG}$, $V_{ERASE}$, $V_D$, $V_{BB}$ and to the charge Q according to the following equation:

$$V_{FG} = \frac{Q + V_{CG}C_G + V_{ERASE}C_E + V_D C_D + V_{BB} C_B}{C_T} \quad (1)$$

In all prior art Eprom and Flash EEprom devices as well as in embodiment 600a of this invention, the dominant factor in $C_T$ is $C_G$, the coupling to the control gate. However, in embodiments 700a, 800a and 900a $C_B$ is also a major contributor by virtue of the fact that the entire bottom surface of the floating gate is strongly coupled to the substrate.

a Electrical Erase

During erase, the typical voltage conditions are $V_{CG}=0V$, $V_D=0V$, $V_S=0V$, $V_{BB}=0V$ and $V_{ERASE}=20V$. Therefore, substituting in equation(1), $$V_{FG}=Q/C_T+20C_E/C_T \quad (2)$$

The electric field for tunnel erase is given by $$E_{ERASE}=V_{ERASE}/t-V_{FG}/t \quad (3)$$

where t is the thickness of the tunnel dielectric. For a given $V_{ERASE}$, $E_{ERASE}$ is maximized by making $V_{FG}$ small, which, from equation (2) is possible if $C_E/C_T$ is small. Embodiments 700a, 800a and 900a allow this condition to be readily met: $C_E$ is small since the area of tunnel dielectric is small, and $C_T$ is large because both $C_G$ and $C_B$ are large. These embodiments are therefore particularly well suited for efficiently coupling the erase voltage across the tunnel dielectric.

b. Multistate storage

Figure 11A:
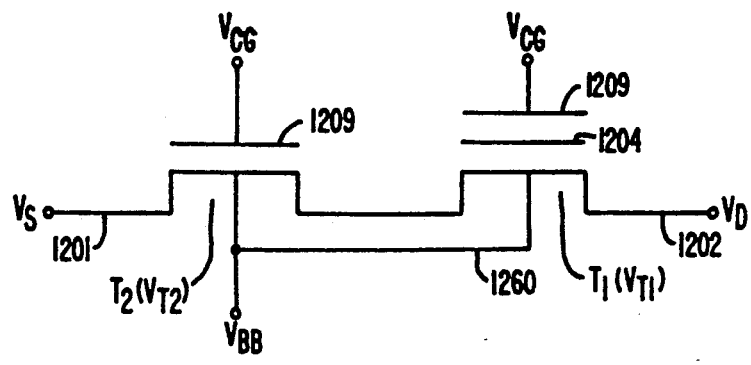
FIG. 11a is a schematic representation of the composite transistor forming a split channel Eprom device.

The split channel Flash EEprom device can be viewed as a composite transistor consisting of two transistors $T_1$ and $T_2$ in series—FIG. 11a. Transistor $T_1$ is a floating gate transistor of effective channel length L1 and having a variable threshold voltage $V_{T1}$. Transistor $T_2$ has a fixed (enhancement) threshold voltage $V_{T2}$ and an effective channel length L2. The Eprom programming characteristics of the composite transistor are shown in curve (a) of FIG. 11b. The programmed threshold voltage $V_{tx}$ is plotted as a function of the time t during which the programming conditions are applied. These programming conditions typically are $V_{CG}=12V$, $V_D=9V$, $V_S=V_{BB}=0V$. No programming can occur if either one of $V_{CG}$ or $V_D$ is at 0V. A virgin (unprogrammed, unerased) device has $V_{T1}=+1.5V$ and $V_{T2}=+1.0V$. After programming for approximately 100 microseconds the device reaches a threshold voltage $V_{tx} \geq +6.0$ volts. This represents the off ("0") state because the composite device does not conduct at $V_{CG}=+5.0V$. Prior art devices employ a so called "intelligent programming" algorithm whereby programming pulses are applied, each of typically 100 microseconds to 1 millisecond duration, followed by a sensing (read) operation. Pulses are applied until the device is sensed to be fully in the off state, and then one to three more programming pulses are applied to ensure solid programmability.

Prior art split channel Flash EEprom devices erase with a single pulse of sufficient voltage $V_{ERASE}$ and sufficient duration to ensure that $V_{T1}$ is erased to a voltage below $V_{T2}$ (curve b) in FIG. 11b). Although the floating gate transistor may continue to erase into depletion mode operation (line (C) in FIG. 11b), the presence of the series T2 transistor obscures this depletion threshold voltage. Therefore the erased on ("1") state is represented by the threshold voltage $V_{tx}=V_{TS}=+1.0V$. The memory storage "window" is given by $\Delta V=V_{Tx}("0")-V_{tx}("1")=6.0-1.0=5.0V$. However, the true memory storage window should be represented by the full swing of $V_{tx}$ for transistor $T_1$. For example, if $T_1$ is erased into depletion threshold voltage $V_{T1}=-3.0V$, then the true window should be given by $\Delta V=6.0-(-3.0)=9.0V$. None of the prior art Flash EEprom devices take advantage of the true memory window. In fact they ignore altogether the region of device operation (hatched region D in FIG. 11b) where $V_{T1}$ is more negative than $V_{T2}$.

$T_1$

This invention proposes for the first time a scheme to take advantage of the full memory window. This is done by using the wider memory window to store more than two binary states and therefore more than a single bit per cell. For example, it is possible to store 4, rather than 2 states per cell, with these states having the following threshold voltage:

State "3": - $V_{T1} = -3.0$ V, $V_{T2} = +1.0$ V
(highest conduction) = 1, 1.
State "2": - $V_{T1} = -0.5$ V, $V_{T2} = +1.0$ V
(intermediate conduction) = 1, 0.
State "1": - $V_{T1} = +2.0$ V, $V_{T2} = +1.0$ V
(lower conduction) = 0, 1.
State "0": - $V_{T1} = +4.5$ V, $V_{T2} = +1.0$ V
(no conduction) = 0, 0.

To sense any one of these four states, the control gate is raised to $V_{CG}=+5.0V$ and the source-drain current $I_{DS}$ is sensed through the composite device. Since $V_{T2}=+1.0V$ for all four threshold states transistor $T_2$ behaves simply as a series resistor. The conduction current $I_{DS}$ of the composite transistor for all 4 states is shown as a function of $V_{CG}$ in FIG. 11c. A current sensing amplifier is capable of easily distinguishing between these four conduction states. The maximum number of states which is realistically feasible is influenced by the noise sensitivity of the sense amplifier as well as by any charge loss which can be expected over time at elevated temperatures. Eight distinct conduction states are necessary for 3 bit storage per cell, and 16 distinct conduction states are required for 4 bit storage per cell.

Multistate memory cells have previously been proposed in conjunction with ROM (Read Only Memory) devices and DRAM (Dynamic Random Access Memory). In ROM, each storage transistor can have one of several fixed conduction states by having different channel ion implant doses to establish more than two permanent threshold voltage states. Alternatively, more than two conduction states per ROM cell can be achieved by establishing with two photolithographic masks one of several values of transistor channel width or transistor channel length. For example, each transistor in a ROM array may be fabricated with one of two channel widths and with one of two channel lengths, resulting in four distinct combinations of channel width and length, and therefore in four distinct conductive states. Prior art multistate DRAM cells have also been proposed where each cell in the array is physically identical to all other cells. However, the charge stored at the capacitor of each cell may be quantized, resulting in several distinct read signal levels. An example of such prior art multistate DRAm storage is described in *IEEE Journal of Solid-State Circuits*, February 1988, p. 27 in an article by M. Horiguchi et al. entitled "An Experimental Large-Capacity Semiconductor File Memory Using 16-Levels/Cell Storage". A second example of prior art multistate DRAM is provided in *IEEE Custom Integrated Circuits Conference*, May 1988, p. 4.4.1 in an article entitled "An Experimental 2-Bit/Cell Storage DRAM for Macrocell or Memory-on-Logic Applications" by T. Furuyama et al.

To take full advantage of multistate storage in Eproms it is necessary that the programming algorithm allow programming of the device into any one of several conduction states. First it is required that the device be erased to a voltage $V_{T1}$ more negative than the "3" state ($-3.0V$ in this example). Then the device is programmed in a short programming pulse, typically one to ten microseconds in, duration. Programming conditions are selected such that no single pulse can shift the device threshold by more than one half of the threshold voltage difference between two successive states. The device is then sensed by comparing its conduction current $I_{DS}$ with that of a reference current source $I_{REF}$, i ($i=0,1,2,3$) corresponding to the desired conduction state (four distinct reference levels must be provided corresponding to the four states). Programming pulses are continued until the sensed current (solid lines in FIG. 11c) drops slightly below the reference current corresponding to the desired one of four states (dashed lines in FIG. 11c). To better illustrate this point, assume that each programming pulse raises $V_{tx}$ linearly by 200 millivolts, and assume further that the device was first erased to $V_{T1} = -3.2V$. Then the number of programming/
$T_1$

---

For state "3" ($V_{T1} = -3.0$ V)
   No. of pulses = (3.2 − 3.0)/.2 = 1
For state "2" ($V_{T1} = -0.5$ V)
   No. of pulses = (3.2 − 0.5)/.2 = 14
For state "1" ($V_{T1} = +2.0$ V)
   No. of pulses = (3.2 − (−2.0))/.2 = 26
and for state "0" ($V_{T1} = +4.5$ V)
   No. of pulses = (3.2 − (−4.5))/.2 = 39.

---

Figure 11B:
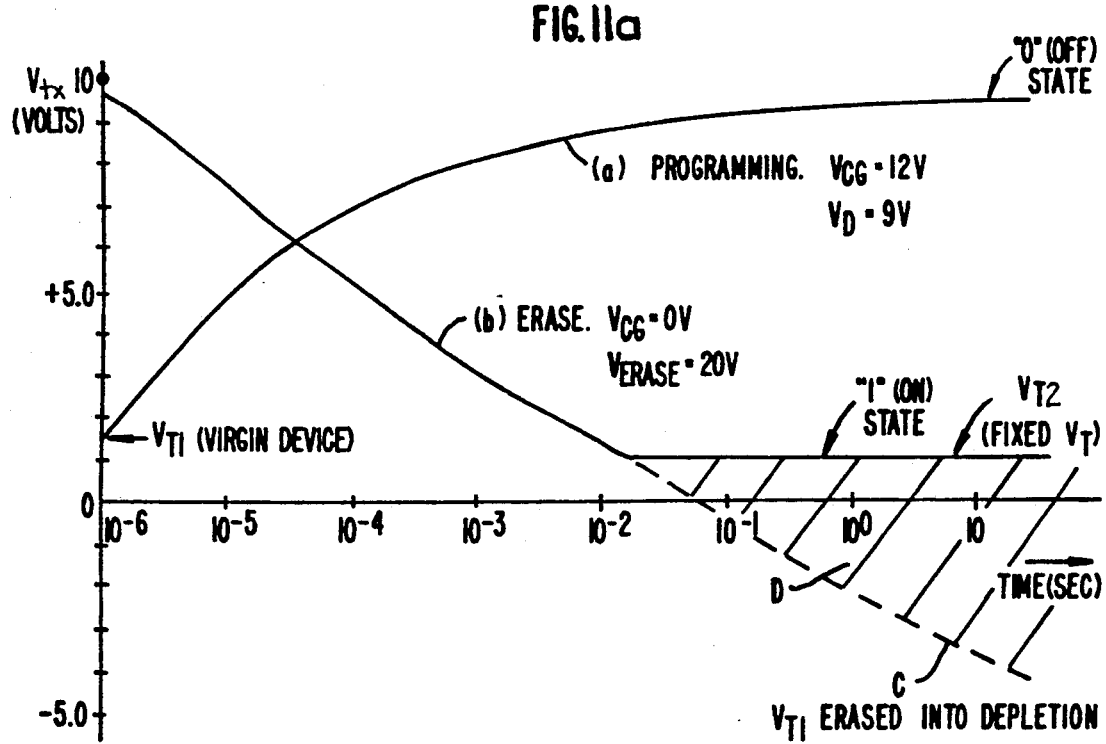
FIG. 11b shows the programming and erase characteristics of a split channel Flash EEprom device.
Figure 11C:
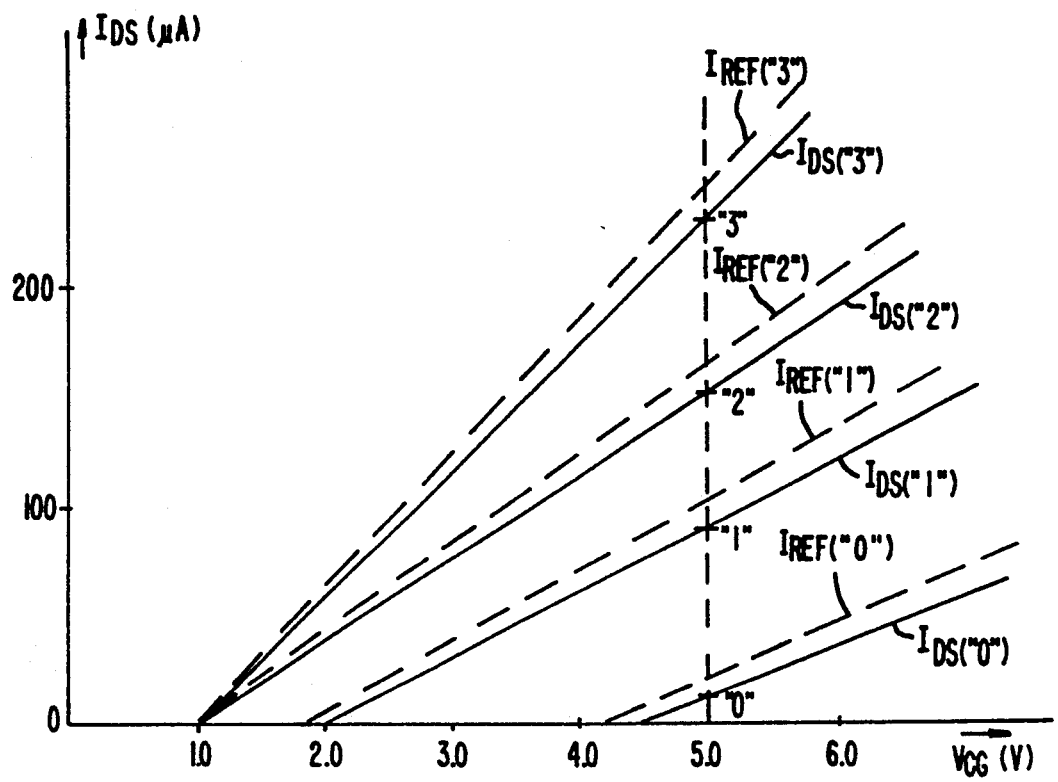
FIG. 11c shows the four conduction states of a split channel Flash EEprom device in accordance with this invention.

In actual fact shifts in $V_{tx}$ are not linear in time, as shown in FIG. 11b(curve (a)), therefore requiring more pulses than indicated for states "1" and "0". If 2 microseconds is the programming pulse width and 0.1 microseconds is the time required for sensing, then the maximum time required to program the device into any of the 4 states is approximately $39 \times 2 + 39 \times .1 = 81.9$ microseconds. This is less than the time required by "intelligent programming algorithms" of prior art devices. In fact, with the new programming algorithm only carefully metered packets of electrons are injected during programming. A further benefit of this approach is that the sensing during reading is the same sensing as that during programming/sensing, and the same reference current sources are used in both programming and reading operations. That means that each and every memory cell in the array is read relative to the same reference level as used during program/sense. This provides excellent tracking even in very large memory arrays.

Large memory systems typically incorporate error detection and correction schemes which can tolerate a small number of hard failures i.e. bad Flash EEprom cells. For this reason the programming/sensing cycling algorithm can be automatically halted after a certain maximum number of programming cycles has been applied even if the cell being programmed has not reached the desired threshold voltage state, indicating a faulty memory cell.

There are several ways to implement the multistate storage concept in conjunction with an array of Flash EEprom transistors. An example of one such circuit is shown in FIG. 11e. In this circuit an array of memory cells has decoded word lines and decoded bit lines connected to the control gates and drains respectively of rows and columns of cells. Each bit line is normally precharged to a voltage of between 1.0 V and 2.0 V during the time between read, program or erase. For a four state storage, four sense amplifiers, each with its own distinct current reference levels IREF,0, IREF,1, IREF,2, and IREF,3 are attached to each decoded output of the bit line. During read, the current through the Flash EEprom transistor is compared simultaneously (i.e., in parallel) with these four reference levels (this operation can also be performed in four consecutive read cycles using a single sense amplifier with a different reference applied at each cycle, if the attendant additional time required for reading is not a concern). The data output is provided from the four sense amplifiers through four Di buffers (D0, D1, D2 and D3).

During programming, the four data inputs Ii (I0, I1, I2 and I3) are presented to a comparator circuit which also has presented to it the four sense amp outputs for the accessed cell. If Di match Ii, then the cell is in the correct state and no programming is required. If however all four Di do not match all four Ii, then the comparator output activates a programming control circuit. This circuit in turn controls the bit line (VPBL) and word line (VPWL) programming pulse generators. A single short programming pulse is applied to both the selected word line and the selected bit line. This is followed by a second read cycle to determine if a match between Di and Ii has been established. This sequence is repeated through multiple programming/reading pulses and is stopped only when a match is established (or earlier if no match has been established but after a preset maximum number of pulses has been reached).

The result of such multistate programming algorithim is that each cell is programmed into any one of the four conduction states in direct correlation with the reference conduction states $I_{REF}$, i. In fact, the same sense amplifiers used during programming/reading pulsing are also used during sensing (i.e., during normal reading). This allows excellent tracking between the reference levels (dashed lines in FIG. 11c) and the programmed conduction levels (solid lines in FIG. 11c), across large memory arrays and also for a very wide range of operating temperatures. Furthermore, because only a carefully metered number of electrons is introduced onto the floating gate during programming or removed during erasing, the device experiences the minimum amount of endurance-related stress possible.

In actual fact, although four reference levels and four sense amplifiers are used to program the cell into one of four distinct conduction states, only three sense amplifiers and three reference levels are required to sense the correct one of four stored states. For example, in FIG. 11c, $I_{REF}$("2") can differentiate correctly between conduction states "3" and "2", $I_{REF}$("1") can differentiate correctly between conduction states "2" and "1", and $I_{REF}$("0") can differentiate correctly between conduction states "1" and "0". In a practical implementation of the circuit of FIG. 11e the reference levels $I_{REF}$ i ($i=0,1,2$) may be somewhat shifted by a fixed amount during sensing to place them closer to the midpoint between the corresponding lower and higher conduction states of the cell being sensed.

Note that the same principle employed in the circuit of FIG. 11e can be used also with binary storage, or with storage of more than four states per cell. Of course, circuits other than the one shown in FIG. 11e are also possible. For example, voltage level sensing rather than conduction level sensing can be employed.

c. Improved Charge Retention

In the example above, states "3" and "2" are the result of net positive charge (holes) on the floating gate while states "1" and "0" are the result of net negative charge (electrons) on the floating gate. To properly sense the correct conduction state during the lifetime of the device (which may be specified as 10 years at 125° C.) it is necessary for this charge not to leak off the floating gate by more than the equivalent of approximately 200 millivolts shift in $V_{T1}$. This condition is readily met for stored electrons in this as well as all prior art Eprom and Flash EEprom devices. There is no data in the literature on charge retention for stored holes, because, as has been pointed out above, none of the prior art devices concern themselves with the value $V_{T1}$ when it is more negative than $V_{T2}$, i.e., when holes are stored on the floating gate. From device physics considerations alone it is expected that retention of holes trapped on the floating gate should be significantly superior to the retention of trapped electrons. This is because trapped holes can only be neutralized by the injection of electrons onto the floating gate. So long as the conditions for such injection do not exist it is almost impossible for the holes to overcome the potential barrier of approximately 5.0 electronvolts at the silicon-silicon dioxide interface (compared to a 3.1 electron volts potential barrier for trapped electrons).

Therefore it is possible to improve the retention of this device by assigning more of the conduction states to states which involve trapped holes. For example, in the example above state "1" had $V_{T1} = +2.0V$, which involved trapped electrons since $V_{T1}$ for the virgin device was made to be $V_{T1} = +1.5V$. If however $V_{T1}$ of the virgin device is raised to a higher threshold voltage, say to $V_{T1} = +3.0V$ (e.g. by increasing the p-type doping concentration in the channel region 560a in FIG. 5a), then the same state "1" with $V_{T1} = +2.0V$ will involve trapped holes, and will therefore better retain this value of $V_{T1}$. Of course it is also possible to set the reference levels so that most or all states will have values of $V_{T1}$ which are lower than the $V_{T1}$ of the virgin device.

d. Intelligent Erase for Improved Endurance

The endurance of Flash EEprom devices is their ability to withstand a given number of program/erase cycles. The physical phenomenon limiting the endurance of prior art Flash EEprom devices is trapping of electrons in the active dielectric films of the device (see the Wegener article referenced above). During programming the dielectric used during hot electron channel injection traps part of the injected electrons. During erasing the tunnel erase dielectric likewise traps some of the tunneled electrons. For example, in prior art transistor 200 (FIG. 2) dielectric 212 traps electrons in region 207 during programming and in region 208 during erasing. The trapped electrons oppose the applied electric field in subsequent write/erase cycles thereby causing a reduction in the threshold voltage shift of $V_{tx}$. This can be seen in a gradual closure (FIG. 11d) in the voltage "window" between the "0" and "1" states of prior art devices. Beyond approximately $1 \times 10^4$ program/erase cycles the window closure can become sufficiently severe to cause the sensing circuitry to malfunction. If cycling is continued the device eventually experiences catastrophic failure due to a ruptured dielectric. This typically occurs at between $1 \times 10^6$ and $1 \times 10^7$ cycles, and is known as the intrinsic breakdown of the device. In memory arrays of prior art devices the window closure is what limits the practical endurance to approximately $1 \times 10^4$ cycles. At a given erase voltage, $V_{ERASE}$, the time required to adequately erase the device can stretch out from 100 milliseconds initially (i.e. in a virgin device) $1 \times 10^4$ cycles. In anticipation of such degradation prior art Flash EEprom devices specify a sufficiently long erase pulse duration to allow proper erase after $1 \times 10^4$ cycles. However this also results in virgin devices being overerased and therefore being unnecessarily overstressed.

A second problem with prior art devices is that during the erase pulse the tunnel dielectric may be exposed to an excessively high peak stress. This occurs in a device which has previously been programmed to state "0" ($V_{T1} = +4.5V$ or higher). This device has a large negative Q (see equation (2)). When $V_{ERASE}$ is applied the tunnel dielectric is momentarily exposed to a peak electric field with components from $V_{ERASE}$ as well as from $Q/C_T$ (equations (2) and (3)). This peak field is eventually reduced when Q is reduced to zero as a consequence of the tunnel erase. Nevertheless, permanent and cumulative damage is inflicted through this erase procedure, which brings about premature device failure.

To overcome the two problems of overstress and window closure a new erase algorithm is disclosed, which can also be applied equally well to any prior art Flash EEprom device. Without such new erase algorithm it would be difficult to have a multistate device since, from curve (b) in FIG. 11d, conduction states having $V_{T1}$ more negative than $V_{T2}$ may be eliminated after $1 \times 10^4$ to $1 \times 10^5$ write/erase cycles.

Figure 12:
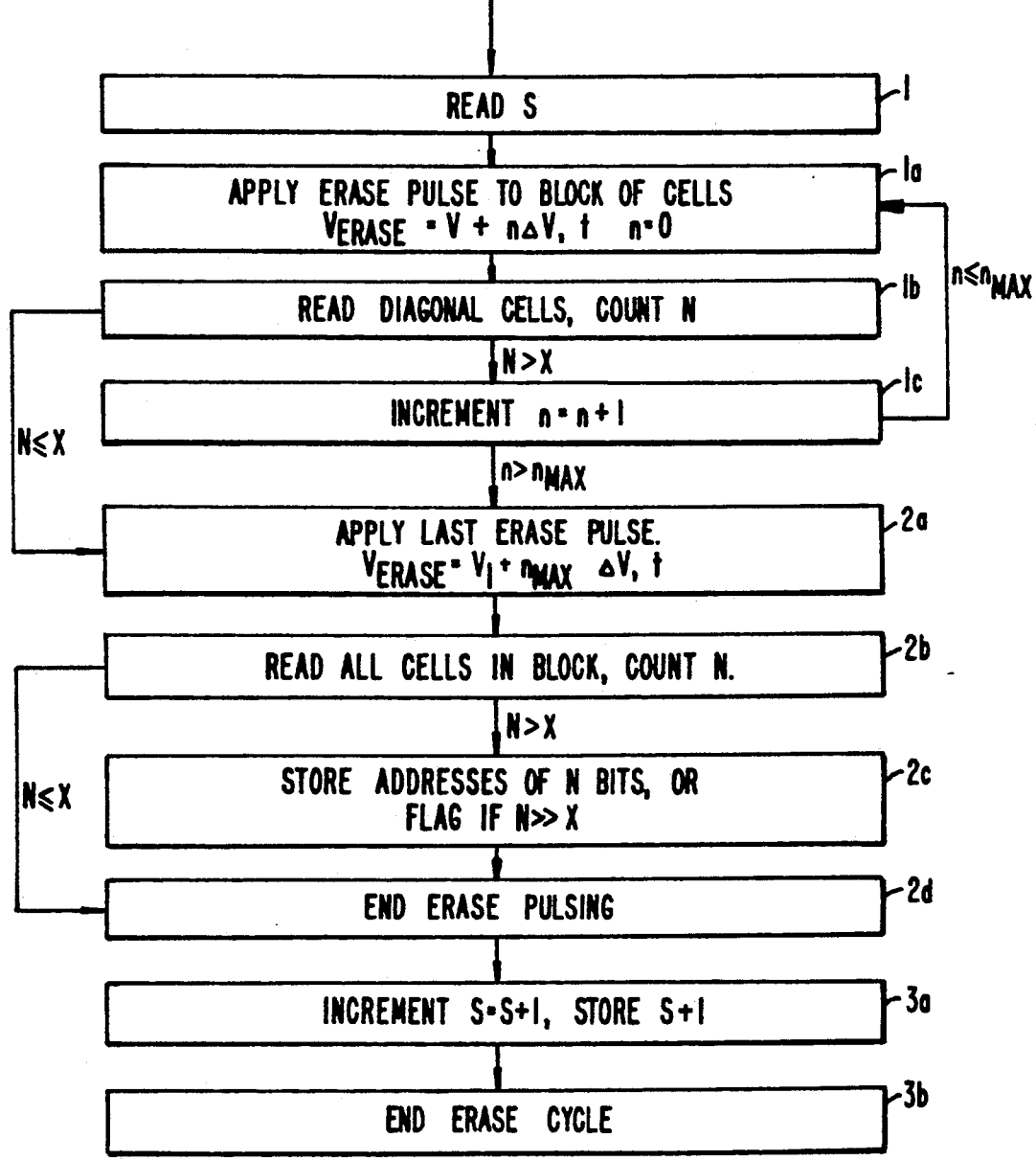
FIG. 12 outlines the key steps in the new algorithm used to erase with a minimum stress.

FIG. 12 outlines the main steps in the sequence of the new erase algorithm. Assume that a block array of mxn memory cells is to be fully erased (Flash erase) to state "3" (highest conductivity and lowest $V_{T1}$ state). Certain parameters are established in conjunction with the erase algorithm. They are listed in FIG. 12: $V_1$ is the erase voltage of the first erase pulse. $V_1$ is lower by perhaps 5 volts from the erase voltage required to erase a virgin device to state "3" in a one second erase pulse. t is chosen to be approximately 1/10th of the time required to fully erase a virgin device to state "3". Typically, $V_1$ may be between 10 and 20 volts while t may be between 10 and 100 milliseconds. The algorithm assumes that a certain small number, X, of bad bits can be tolerated by the system (through for example error detection and correction schemes implemented at the system level. If no error detection and correction is implemented then X=0). These would be bits which may have a shorted or leaky tunnel dielectric which prevents them from being erased even after a very long erase pulse. To avoid excessive erasing the total number of erase pulses in a complete block erase cycling can be limited to a preset number, $n_{max}$. $\Delta V$ is the voltage by which each successive erase pulse is incremented. Typically, $\Delta V$ is in the range between 0.25V and 1.0V. For example, if $V_1 = 15.0V$ and $\Delta V = 1.0V$, then the seventh erase pulse will be of magnitude $V_{ERASE} = 21.0V$ and duration t. A cell is considered to be fully erased when its read conductance is greater than $I_{"3"}$. The number S of complete erase cyclings experienced by each block is an important information at the system level. If S is known for each block then a block can be replaced automatically with a new redundant block once S reaches $1 \times 10^6$ (or any other set number) of program/erase cycles. S is set at zero initially, and is incremented by one for each complete block erase multiple pulse cycle. The value of S at any one time can be stored by using for example twenty bits ($2^{20}$ equals approximately $1 \times 10^6$) in each block. That way each block carries its own endurance history. Alternatively the S value can be stored off chip as part of the system.

The sequence for a complete erase cycle of the new algorithm is as follows (see FIG. 12):

1. Read S. This value can be stored in a register file. (This step can be omitted if S is not expected to approach the endurance limit during the operating lifetime of the device).

1a. Apply a first erase pule with $V_{ERASE}=V_1+n \Delta V$, n=0, pulse duration =t. This pulse (and the next few successive pulses) is insufficient to fully erase all memory cells, but it serves to reduce the charge Q on programmed cells at a relatively low erase field stress, i.e., it is equivalent to a "conditioning" pulse.

1b. Read a sparse pattern of cells in the array. A diagonal read pattern for example will read m+n cells (rather than mxn cells for a complete read) and will have at least one cell from each row and one cell from each column in the array. The number N of cells not fully erased to state "3" is counted and compared with X.

1c. If N is greater than x (array not adequately erased) a second erase pulse is applied of magnitude greater by $\Delta V$ than the magnitude of the first pulse, with the same pulse duration, t. Read diagonal cells, count N.

This cycling of erase pulse/read/increment erase pulse is continued until either $N \leq x$ or the number n of erase pulses exceed $n_{max}$. The first one of these two conditions to occur leads to a final erase pulse.

2a. The final erase pulse is applied to assure that the array is solidly and fully erased. The magnitude of $V_{ERASE}$ can be the same as in the previous pulse or higher by another increment $\Delta V$. The duration can be between 1t and 5t.

2b. 100% of the array is read. The number N of cells not fully erased is counted. If N is less than or equal to X, then the erase pulsing is completed at this point.

2c. If N is greater than X, then address locations of the N unerased bits are generated, possibly for substitution with redundant good bits at the system level. If N is significantly larger than X (for example, if N represents perhaps 5% of the total number of cells), then a flag may be raised, to indicate to the user that the array may have reached its endurance end of life.

2d. Erase pulsing is ended.

3a. S is incremented by one and the new S is stored for future reference. This step is optional. The new S can be stored either by writing it into the newly erased block or off chip in a separate register file.

3b. The erase cycle is ended. The complete cycle is expected to be completed with between 10 to 20 erase pulses and to last a total of approximately one second.

The new algorithm has the following advantages:

(a) No cell in the array experiences the peak electric field stress. By the time $V_{ERASE}$ is incremented to a relatively high voltage any charge Q on the floating gates has already been removed in previous lower voltage erase pulses.

(b) The total erase time is significantly shorter than the fixed $V_{ERASE}$ pulse of the prior art. Virgin devices see the minimum pulse duration necessary to erase. Devices which have undergone more than $1 \times 10^4$ cycles require only several more $\Delta V$ voltage increments to overcome dielectric trapped charge, which only adds several hundred milliseconds to their total erase time.

Figure 11D:
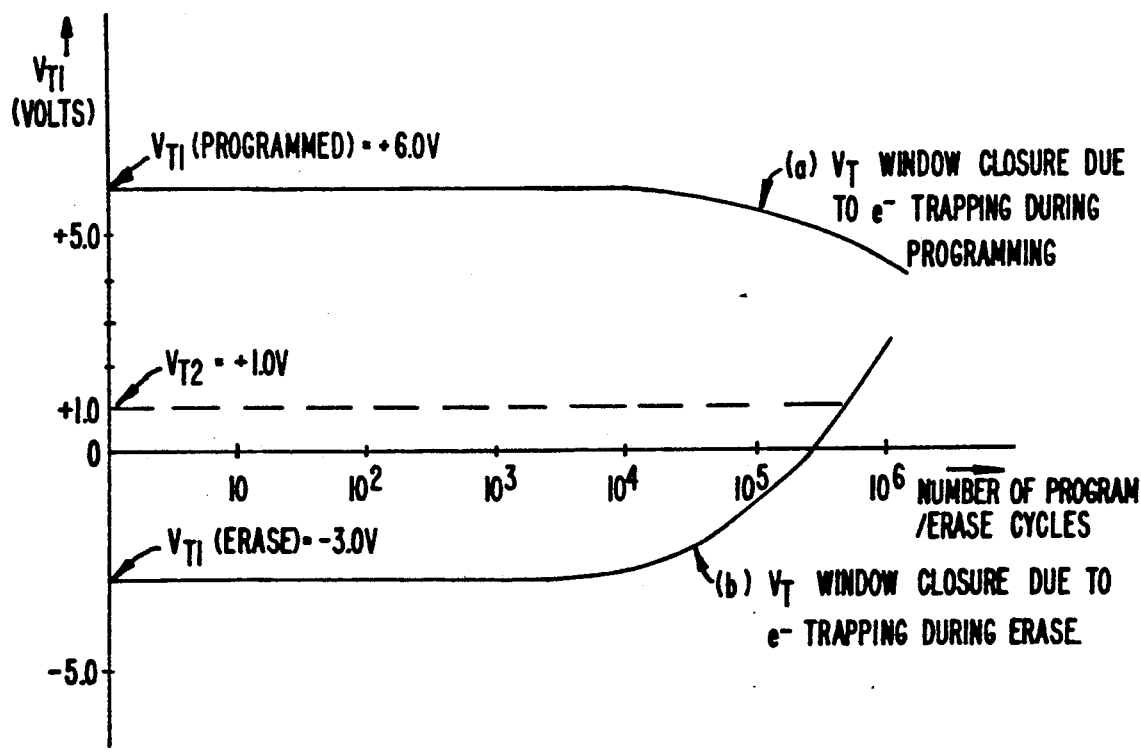
FIG. 11d shows the program/erase cycling endurance characteristics of prior art Flash EEprom devices.
Figure 11E:
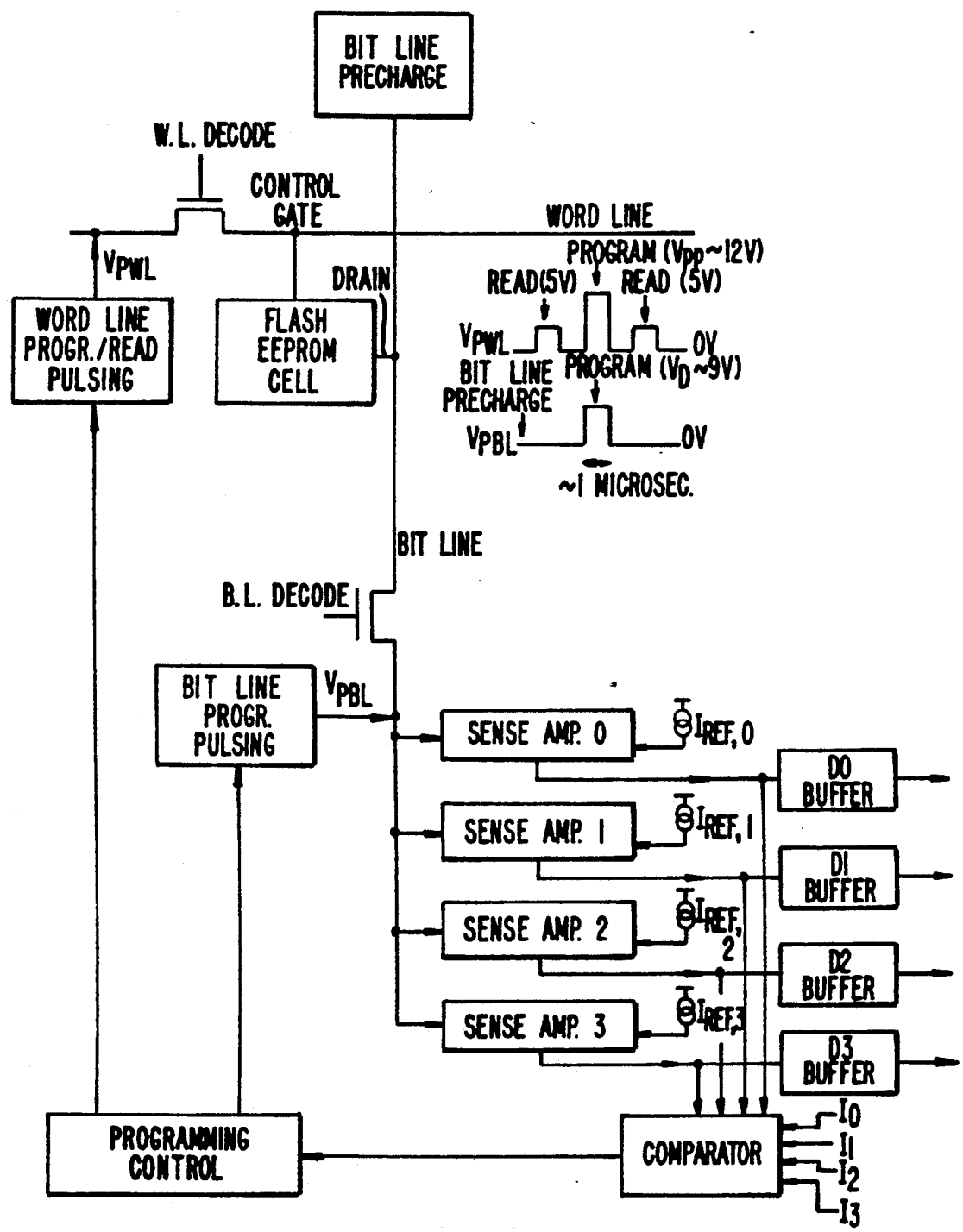
FIG. 11e shows a circuit schematic and programming/read voltage pulses required to implement multistate storage.

(c) The window closure on the erase side (curve (b) in FIG. 11d) is avoided indefinitely (until the device experiences failure by a catastrophic breakdown) because $V_{ERASE}$ is simply incremented until the device is erased properly to state "3". Thus, the new erase algorithm preserves the full memory window.

Figure 13:
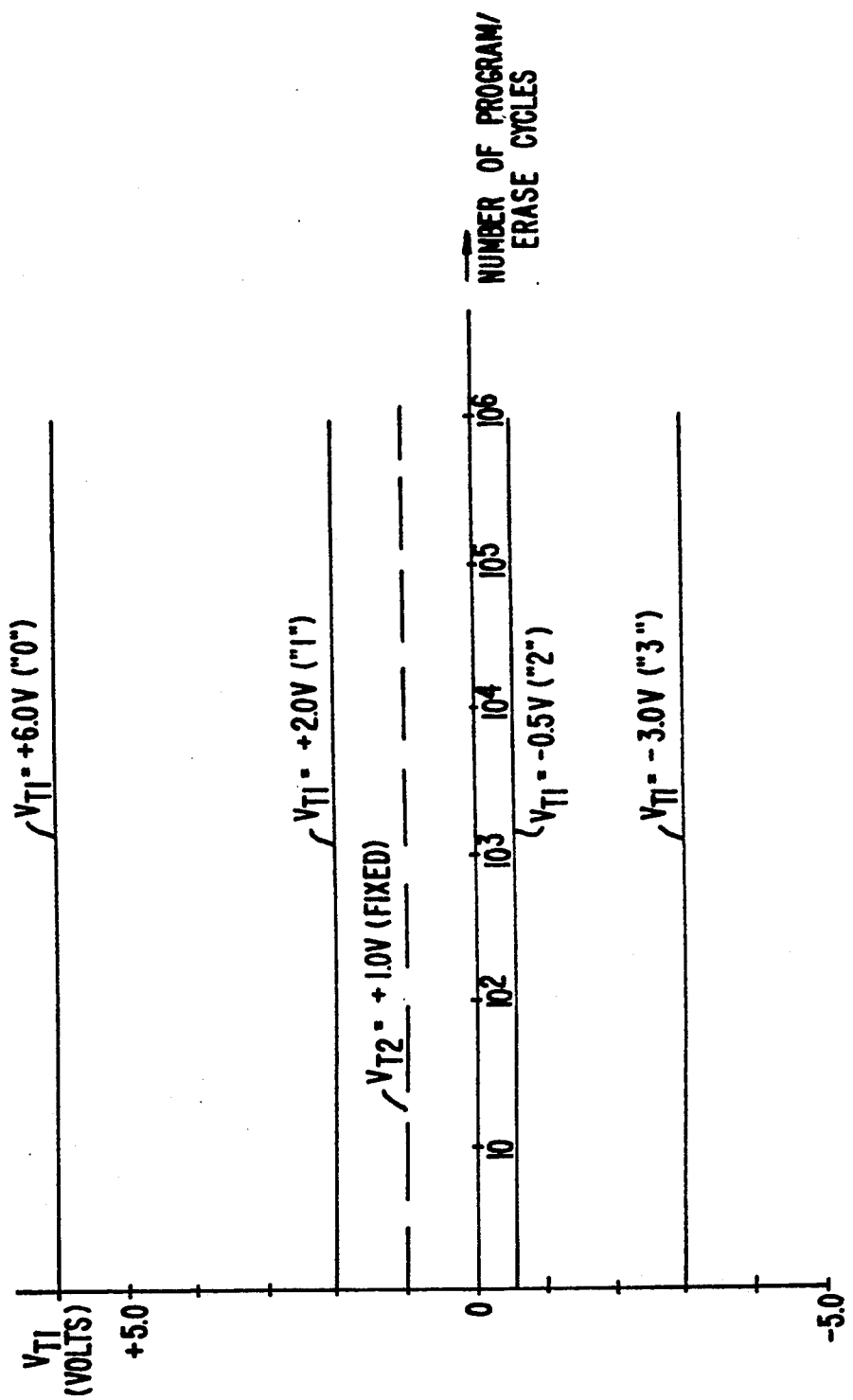
FIG. 13 shows the program/erase cycling endurance characteristics of the split channel Flash EEprom device of this invention using intelligent algorithms for multistate programming and for reduced stress during erasing.

FIG. 13 shows the four conduction states of the Flash EEprom devices of this invention as a function of the number of program/erase cycles. Since all four states are always accomplished by programming or erasing to fixed reference conduction states, there is no window closure for any of these states at least until $1 \times 10^6$ cycles.

In a Flash EEprom memory chip it is possible to implement efficiently the new erase algorithm by providing on chip (or alternatively on a separate controller chip) a voltage multiplier to provide the necessary voltage V1 and voltage increments $\Delta V$ to $n\Delta V$, timing circuitry to time the erase and sense pulse duration, counting circuitry to count N and compare it with the stored value for X, registers to store address locations of bad bits, and control and sequencing circuitry, including the instruction set to execute the erase sequence outlined above.

VII. Edge Tailored Flash EEprom with New Erase Mechanism

Flash EEprom embodiments 600a, 700a, 800a, and 900a of this invention use tunnel erase across a relatively thick dielectric oxide grown on the textured surface of the polysilicon floating gate. Wegener (see article referenced above) has postulated that asperities small, bump-like, curved surfaces of diameter of approximately 30 nanometers, enhance the electric field at the injector surface (in this case, the floating gate) by a factor of 4 to 5, thereby allowing efficient tunnel conduction to occur even across a relatively thick tunnel dielectric film (30 to 70 nanometers). Accordingly, there have been in the prior art efforts, through process steps such as high temperature oxidation of the polysilicon surface, to shape the surface of the polysilicon so as to accentuate these asperities. Although such steps are reproducible, they are empirical in nature, somewhat costly to implement, and not well understood.

A new approach is disclosed in this invention which results in a highly reproducible, enhanced electric field tunnel erase which is more efficient than the asperities method yet simpler to implement in several EEprom and Flash EEprom devices. In this approach, the floating gate layer is deposited in a very thin layer, typically in the range between 25 and 200 nanometers. This is much thinner than floating gates of all prior art Eprom, EEprom or Flash EEprom devices, which typically use a layer of polysilicon of thickness at least 200 nanometers, and usually more like 350 to 450 nanometers. The prior art polysilicon thickness is chosen to be higher than 200 nanometers primarily because of the lower sheet resistivity and better quality polyoxides provided by the thicker polysilicon. In certain prior art devices such as the Eitan split channel Eprom the floating gate also serves as an implant mask (FIG. 4b) and must therefore be sufficiently thick to prevent penetration of the implant ions. Likewise, in the split channel Eprom embodiment 500a (FIG. 5a) the spacer formation (FIGS. 5b through 5f) cannot be readily implemented if floating gate 504a is 100 nanometers or less in thickness. However, Eprom transistor 1400 (FIG. 14c) and Flash EEprom transistors 600a (FIG. 6a), 700a (FIG. 7a), 800a (FIG. 8a) and 900a (FIG. 9a) as well as the Kupec prior art transistor 200b (FIG. 2b) can all be implemented with a floating gate of thickness 100 nanometers or less to achieve a significant improvement in erase efficiency.

The reason for going to such a thin layer of polysilicon is that the edges of the floating gate in such a thin layer can be tailored through oxidation to form extremely sharp-tipped edges. The radius of curvature of these tipped edges can be made extremely small and is dictated by the thickness of the thin polysilicon film as well as the thickness of the tunnel dielectric grown. Therefore, tunnel erase from these sharp tips no longer depends on surface asperities but instead is dominated by the tip itself.

Figure 16A:
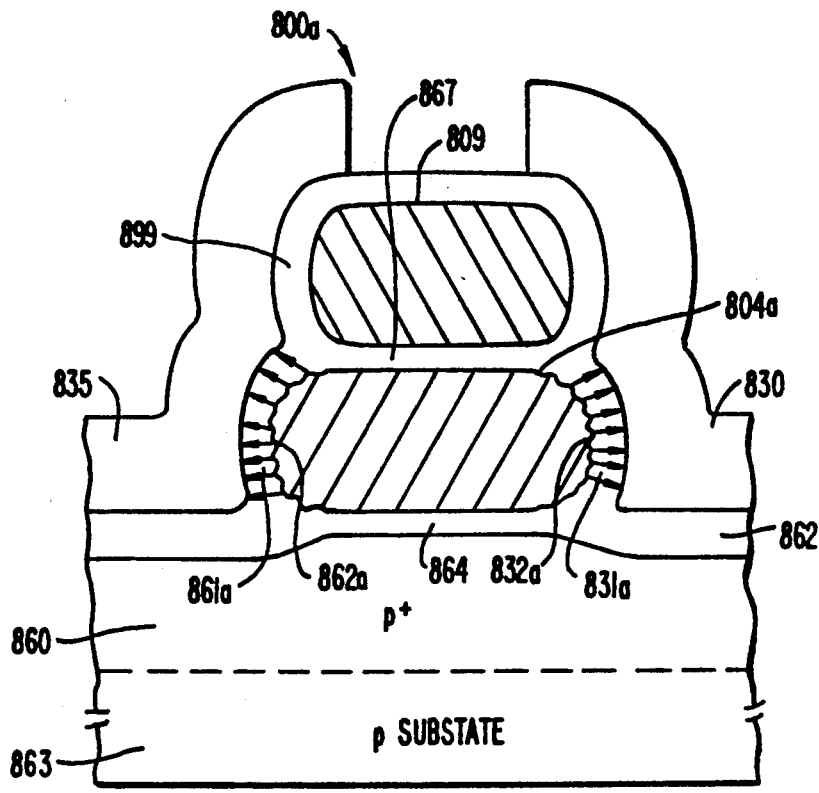
FIGS. 16a and 16b are cross sectional views of Flash EEprom transistors, illustrating the erase mechanism by asperity injection (16a) and sharp tip injection (16b).
Figure 16B:
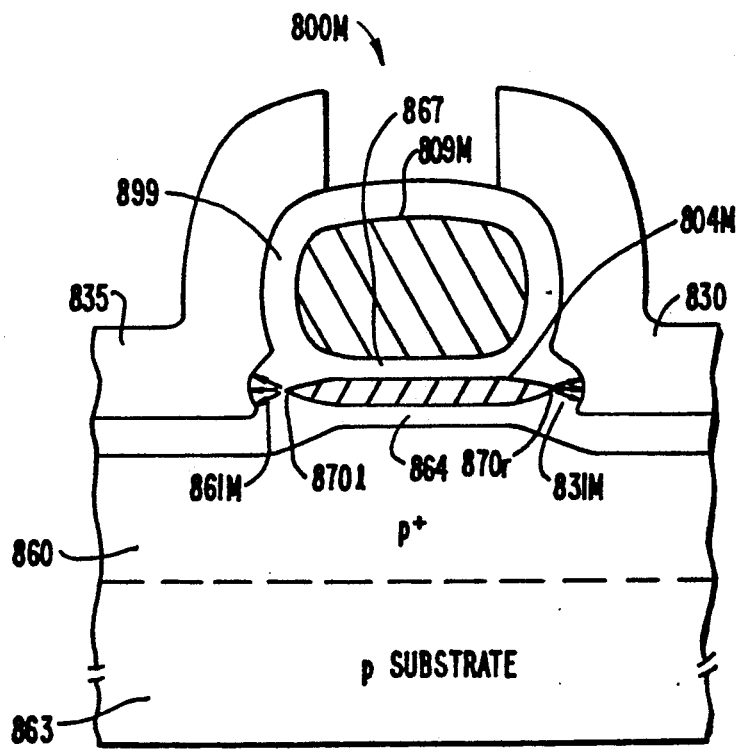

As an illustration of this modification, consider Flash EEprom transistor 800a (FIG. 8a) in two different embodiments, a relatively thick floating gate (transistor 800a shown in FIG. 8b and FIG. 16a) and the same transistor modified to have a very thin floating gate (transistor 800M shown in FIG. 16b). In the cross section view of FIG. 16a (corresponding to direction AA of FIG. 8a), floating gate 804a is approximately 300 nanometers thick. Its vertical edges 862a, 832a are shown having a multitude of small asperities at the surface. Each asperity acts as an electron injector during tunnel erase (shown by the direction of the arrows across tunnel dielectric layers 861a, 831a). Injected electrons are collected by erase gates 835, 830 which overlap vertical edges 862a, 832a.

By contrast, the cross section view of modified transistor 800M is shown in FIG. 16b (along the same cross section AA of FIG. 8a) shows a transistor with floating gate 804M of thickness 100 nanometers or less. Dielectric layers 864 and 867 as well as control gate 809 can be the same as in transistor 800a.

During oxidation of the thin vertical edges of floating gate 804M to form tunnel dielectric layers 861M, 831M, both top and bottom surfaces of the thin floating gate at its exposed edges are oxidized. This results in extremely sharp tips 870l, 870r being formed. These tips serve as very efficient electron injectors (shown by arrows across tunnel dielectrics 861M, 831M). Injected electrons are collected as in transistor 800a by erase gates 835, 830, which overlap these sharp-tipped edges.

Apart from the very efficient and highly reproducible injector characteristics inherent to the thin floating gate of transistor 800M there is an additional benefit in that the capacitance between the floating gate at its tip and the erase gate is much smaller than the corresponding capacitance in all other embodiments, including transistor 800a. Therefore, from equations (1), (2) and (3) in section VI.a., since $C_E << C_T$, Therefore, $V_{FG} = Q/C_T$, and $E_{ERASE} = (V_{ERASE} - Q/C_T)/t$.

When $Q = 0$ (virgin device), then $$E_{ERASE} = V_{ERASE}/t \quad (4)$$

Equation (4) basically states that when $C_E$ is very small relative to $C_T$, then essentially 100% of the erase voltage $V_{ERASE}$ is effectively applied across the tunnel dielectric layer of thickness t. This allows a reduction of the magnitude of $V_{ERASE}$ necessary to erase the device. Also, a very small $C_E$ allows all other device capacitances contributing to $C_T$ (in FIG. 10) to be made small, which leads to a highly scalable Flash EEprom device. The thinner floating gate also helps to improve metalization step coverage and to reduce the propensity to form polysilicon stringers in the manufacturing process.

Two other points are worth noting. First, the very thin floating gate should not be overly heavily doped, to avoid penetration of the N+ dopant through polysilicon 804M and gate dielectric 864. Since floating gate 804M is never used as a current conductor, a sheet resistivity of between 100 and 10,000 Ohms per square in quite acceptable.

Secondly, it is necessary to ensure that the sharp tips of the floating gate are adequately spaced apart or isolated from control gate 809M as well as substrate 860 or the source or drain diffusions (not shown in FIG. 16b). This is because the sharp tip injection mechanism can be so highly effective that unintended partial erase to these surfaces may take place under the voltage conditions prevailing during device programming (i.e., a "program disturbance" condition). This problem is not necessarily a severe one because, looking again at equations (1), (2) and (3), capacitance components $C_G$, $C_D$ and $C_B$ are each much larger than $C_E$ and therefore the electric field between the floating gate at its edges and any of these three surfaces is much less than $E_{ERASE}$. Nevertheless, this should be an important consideration in the actual geometrical layout of any floating gate transistor using a very thin floating gate for edge erase.

Figure 16C:
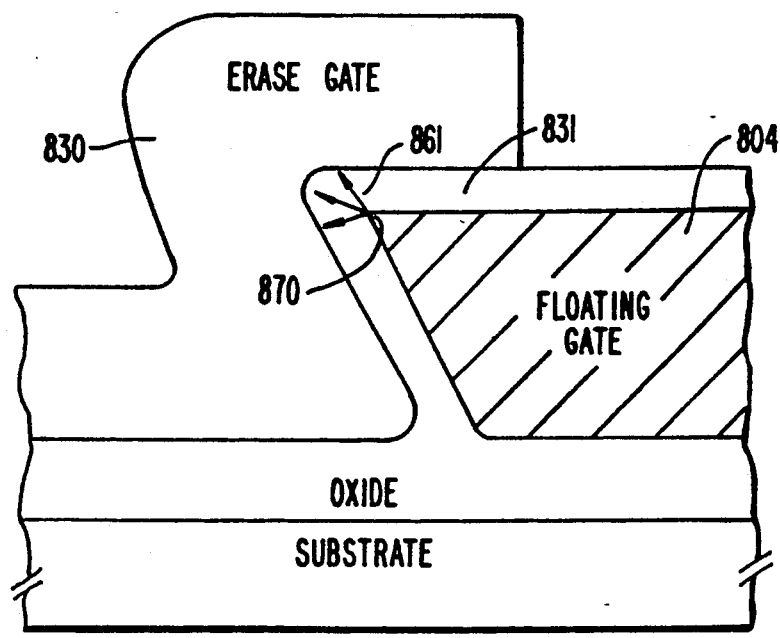
FIGS. 16c and 16d are cross sectional views of parts of Flash EEprom transistors illustrating the formation of sharp-tipped edges of the floating gate by directional etching to facilitate high field electronic injection.

Although a thin floating gate layer provides a relatively straight forward approach to achieving after oxidation sharp-tipped edges, other approaches are possible to achieve sharp-tipped edges even in a relatively thick floating gate layer. For example, in FIG. 16c a relatively thick layer forming floating gate 804 is etched with a reentrant angle of etching. After oxidation, a sharp tip 870 is formed at the top edge, facilitating high field tunneling 861 to the erase gate 830 deposited on top of the tunnel erase dielectric 831.

Figure 16D:
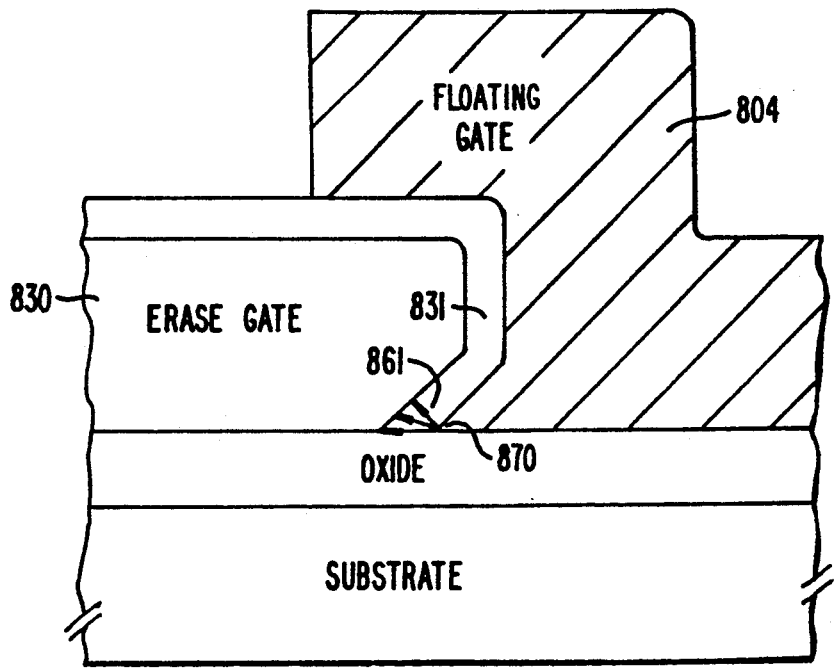

In the device of FIG. 16d the erase gate is deposited before the floating gate. Erase gate 830 is etched so as to create a reentrant cavity close to its bottom surface. Tunnel erase dielectric 831 is then grown, followed by deposition and formation of floating gate 804. Floating gate 804 fills the narrow reentrant cavity where a sharp tip 870 is formed, which facilitates the high field tunneling 861. Note that the device of FIG. 16d has asperities formed at the surface of the erase gate whereas all other devices described in this invention have asperities formed at the surfaces of their floating gate.

VIII. Flash EEprom Memory Array Implementations

Figure 15B:
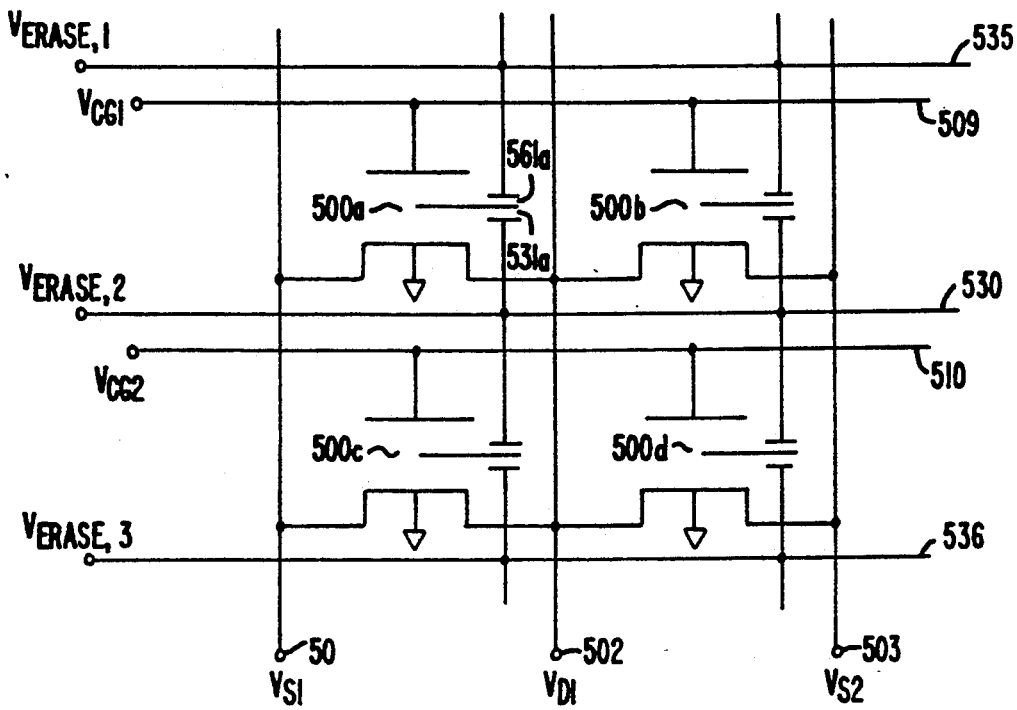
FIGS. 15a and 15b are schematic representations of two memory arrays for the Flash EEprom embodiments of this invention.
Figure 15A:
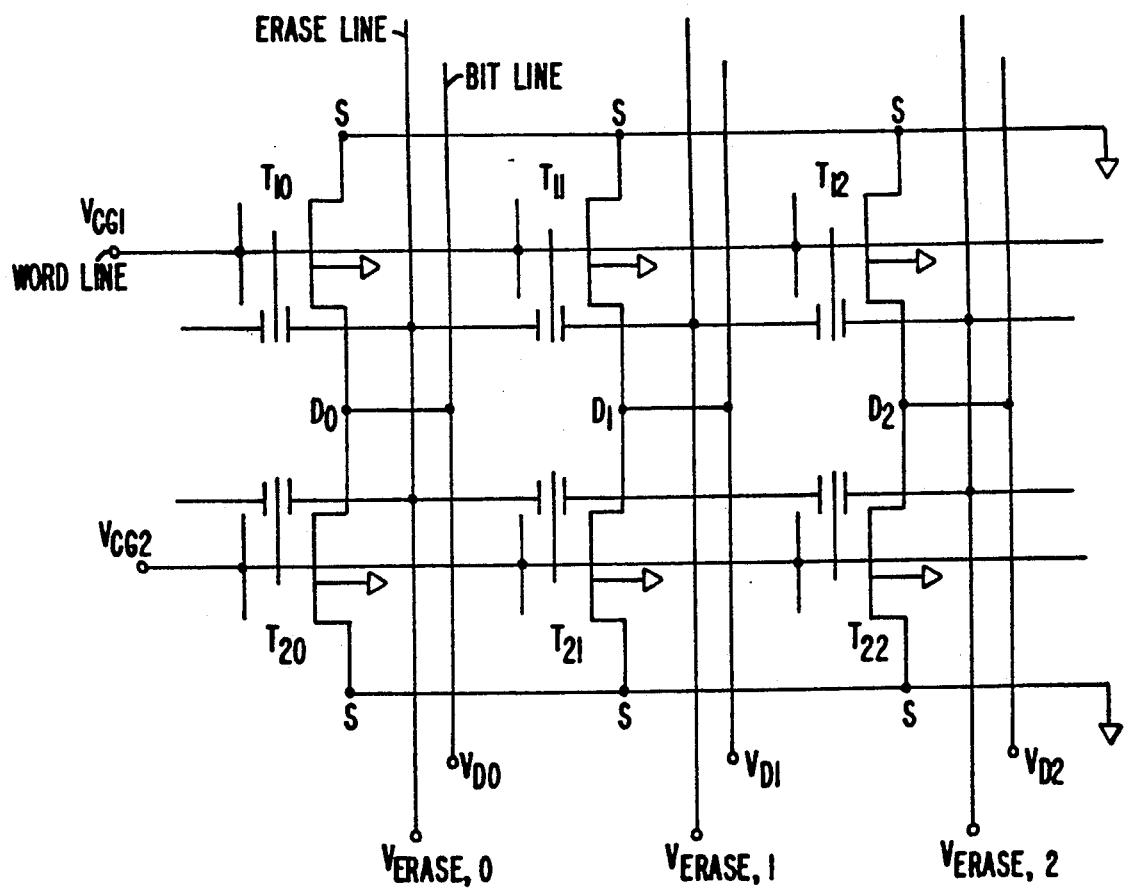

The Flash EEprom cells of this invention can be implemented in dense memory arrays in several different array architectures. The first architecture, shown in FIG. 15a, is the one commonly used in the industry for Eprom arrays. The 3×2 array of FIG. 15a shows two rows and three columns of Flash EEprom transistors. Transistors T10, T11, T12 along the first row share a common control gate (word line) and a common source S. Each transistor in the row has its own drain D connected to a column bit line which is shared with the drains of all other transistors in the same column. The floating gates of all transistors are adjacent their drains, away from their sources. Erase lines are shown running in the bit line direction (can also run in the word line direction), with each erase line coupled (through the erase dielectric) to the floating gates of the transistors to the left and to the right of the erase line. The voltage conditions for the different modes of operation are shown in Table I (FIG. 17a) for the selected cell as well as for unselected cells sharing either the same row (word line) or the same column (bit line). During block erase of all the cells in the array, all erase lines are brought high. However, it is also possible to erase only sectors of the array by taking $V_{ERASE}$ high for pairs of erase gates only in these sectors, keeping all other erase lines at 0V.

A second Flash EEprom memory array architecture which lends itself to better packing density than the array of FIG. 15a is known as the virtual ground array (for a detailed description of this array architecture, see the Harari patent referenced herein). A topological view of such an array of cells was provided in FIGS. 6a, 7a, 8a and 9a. A schematic representation of a 2×2 virtual ground memory array corresponding to the array of FIG. 6a is shown in FIG. 15b. In a virtual ground array, the source and drain regions are used interchangeably. For example, diffusion 502 is used as the drain of transistor 600a and as the source of transistor 600b. The term virtual ground comes from the fact that the ground supply applied to the source is decoded rather than hard-wired. This decoding allows the source to be used interchangeably as ground line or drain. The operating conditions in the virtual ground array are given in Table II (FIG. 17b). They are essentially the same as that for the standard architecture array, except that all source and drain columns of unselected cells are left floating during programming to prevent accidental program disturbance. During reading all columns are pulled up to a low voltage (about 1.5V) and the selected cell alone has its source diffusion pulled down close to ground potential so that its current can be sensed.

The array can be erased in a block, or in entire rows by decoding the erase voltage to the corresponding erase lines.

While the embodiments of this invention that have been described are the preferred implementations, those skilled in the art will understand that variations thereof may also be possible. In particular, the split channel Flash EEprom devices 600a, 700a, 800a and 900a can equally well be formed in conjunction with a split channel Eprom composite transistor 500a having channel portions L1 and L2 formed in accordance with the one-sided spacer sequence outlined in FIGS. 5b through 5f, or in accordance with Eprom transistor 1400, or with Eprom transistors formed in accordance with other self-aligning process techniques or, altogether in non self-aligning methods such as the ones employed in the prior art by Eitan, Samachisa, Masuoka and Harari. Therefore, the invention is entitled to protection within the full scope of the appended claims.

It is claimed is:

1. A method of forming an array of split-channel flash electrically programmable read only memory cells on a semiconductor substrate surface, comprising the steps of:

providing a plurality of parallel elongated source and drain regions spaced across the substrate surface, a length of said regions extending in a first direction and being spaced apart in a second direction to form channel regions therebetween, said first and second directions being substantially orthogonal to each other, forming a first plurality of continuous parallel conductive strips with their lengths extending in said first direction and having widths extending in said second direction part way across said channels, thereby to leave a portion of the channel regions uncovered of said first strips, said first strips being insulated from said substrate surface by a thin gate dielectric layer, forming a second plurality of continuous parallel conductive strips with their lengths extending in said second direction and being spaced apart in said first direction, said second strips being insulated from said first strips and from the exposed substrate surface therebetween, removing at least a portion of said first strips inbetween said second strips by using said second strips as a mask in a manner that the remaining portions of the first strips have edges in said first direction which are aligned with edges of said second strips under which they lie, thereby to form isolated floating gates from said first strips that underlay said second strips as control gates, and forming a third plurality of continuous parallel conductive strips with their lengths extending in said second direction and positioned in said first direction inbetween said second strips, said third strips forming erase gates that are positioned adjacent edges of floating gates with a tunnel dielectric therebetween.

2. The method according to claim 1 wherein the step of removing at least a portion of the first strips includes etching said first strips with only said second strips forming said mask.

3. The method according to claim 1 wherein the step of removing at least a portion of the first strips includes etching said first strips with said second strips and a dielectric spacer along edges of said second strips forming said mask.

4. The method according to claim 1 wherein the steps of forming the first, second and third plurality of conductive strips include forming respective first, second and third different layers of polysilicon material.

5. A method of forming an array of split-channel flash electrically programmable read only memory cells on a semiconductor substrate surface comprising the steps of:

forming a plurality of parallel elongated source and drain regions beneath the substrate surface and spaced thereacross, a length of said regions extending in a first direction and being spaced apart in a second direction to form channel regions therebetween, said first and second directions being substantially orthogonal to each other, forming a first dielectric layer on said semiconductor surface, forming on said first dielectric layer a first plurality of continuous parallel conductive strips with their lengths extending in said first direction and having widths extending in said second direction part way across said channels, thereby to leave a portion of the channel regions uncovered of said first strips, forming a second dielectric layer on said first plurality of conductive strips, forming on said first and second dielectric layers a second plurality of continuous parallel conductive strips with their lengths extending in said second direction and being spaced apart in said first direction, whereby said second strips are insulated from said first strips and from regions of the substrate surface therebetween, removing at least a portion of said first strips in between said second strips by using said second strips as a mask in a manner to convert the first strips into isolated floating gates underlaying said second strips as control gates and having exposed surfaces in spaces between the control gates, forming a third dielectric layer over at least said floating gate exposed ends, and forming in spaces between said control gate a third plurality of continuous parallel conductive strips with their lengths extending in said second direction and in contact with said third dielectric layer that is carried by the floating gate exposed surfaces in such spaces.

6. The method according to claim 5 wherein the step of removing at least a portion of the first strips includes etching said first strips with only said second strips forming said mask.

7. The method according to claim 5 wherein the step of removing at least a portion of the first strips includes etching said first strips with said second strips and a dielectric spacer along edges of said second strips forming said mask.

8. The method according to claim 5 wherein the steps of forming the first, second and third plurality of conductive strips include forming respective first, second and third different layers of polysilicon material.

* * * * *